US009882113B1

(12) United States Patent
Henry et al.

(10) Patent No.: US 9,882,113 B1
(45) Date of Patent: Jan. 30, 2018

(54) GALLIUM BEAM LITHOGRAPHY FOR SUPERCONDUCTIVE STRUCTURE FORMATION

(71) Applicant: National Technology & Engineering Solutions of Sandia, LLC, Albuquerque, NM (US)

(72) Inventors: Michael David Henry, Albuquerque, NM (US); Rupert M. Lewis, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 264 days.

(21) Appl. No.: 14/742,505

(22) Filed: Jun. 17, 2015

Related U.S. Application Data

(60) Provisional application No. 62/016,038, filed on Jun. 23, 2014, provisional application No. 62/016,033, filed on Jun. 23, 2014.

(51) Int. Cl.
| | |
|---|---|
| *H01L 23/48* | (2006.01) |
| *H01L 39/24* | (2006.01) |
| *H01J 37/305* | (2006.01) |
| *H01J 37/21* | (2006.01) |
| *H01B 12/02* | (2006.01) |
| *H01L 39/02* | (2006.01) |
| *H01L 39/12* | (2006.01) |
| *H01L 39/22* | (2006.01) |

(52) U.S. Cl.
CPC ........... *H01L 39/249* (2013.01); *H01B 12/02* (2013.01); *H01J 37/21* (2013.01); *H01J 37/3056* (2013.01); *H01L 39/025* (2013.01); *H01L 39/125* (2013.01); *H01L 39/223* (2013.01); *H01L 39/2406* (2013.01); *H01L 39/2409* (2013.01); *H01L 39/2416* (2013.01); *H01L 39/2493* (2013.01); *H01J 2237/213* (2013.01); *H01J 2237/3175* (2013.01)

(58) Field of Classification Search
CPC ........ H01L 39/249; H01B 12/02; H01J 37/21; H01J 37/3056
USPC .......................................... 505/190
See application file for complete search history.

(56) References Cited

U.S. PATENT DOCUMENTS

| | | | |
|---|---|---|---|
| 8,557,612 B2 | 10/2013 | Henry et al. | |
| 8,557,613 B2 | 10/2013 | Shearn et al. | |
| 2003/0198755 A1* | 10/2003 | Shichi ................... | C23C 16/045 427/596 |

(Continued)

OTHER PUBLICATIONS

Akaike H et al., "Fabrication of Nb/AlOx/Nb tunnel junctions using focused ion beam implanted Nb patterning (FINP) technique," *IEEE Trans. Appl. Superconduct.* 1993;3(1):2187-90.

(Continued)

*Primary Examiner* — Paul Wartalowicz
(74) *Attorney, Agent, or Firm* — Martin I. Finston

(57) ABSTRACT

The present invention relates to the use of gallium beam lithography to form superconductive structures. Generally, the method includes exposing a surface to gallium to form an implanted region and then removing material adjacent to and/or below that implanted region. In particular embodiments, the methods herein provide microstructures and nanostructures in any useful substrate, such as those including niobium, tantalum, tungsten, or titanium.

17 Claims, 12 Drawing Sheets

(56) References Cited

U.S. PATENT DOCUMENTS

| | | | | |
|---|---|---|---|---|
| 2005/0103746 | A1* | 5/2005 | Nadeau | G11B 5/3163 216/62 |
| 2007/0056926 | A1* | 3/2007 | Ko | H01L 21/32137 216/67 |

OTHER PUBLICATIONS

Akaike H et al., "Fabrication of submicron Nb/AlOx-Al/Nb tunnel junctions using focused ion beam implanted Nb patterning (FINP) technique," *IEEE Trans. Appl. Superconduct.* 1995;5(2):2310-3.

Böttger R et al., "Characterization of Si nanowires fabricated by Ga$^+$ FIB implantation and subsequent selective wet etching," *J. Micromech. Microeng.* 2011;21:095025 (8 pp.).

Brun T et al., "Silicon nanowire based Pirani sensor for vacuum measurements," *Appl. Phys. Lett.* 2012;101:183506 (4 pp.).

Chekurov N et al., "The fabrication of silicon nanostructures by local gallium implantation and cryogenic deep reactive ion etching," *Nanotechnology* 2009;20(6):065307 (5 pp.).

Crotty P et al., "Josephson junction simulation of neurons," *Phys. Rev. E* 2010;82:011914 (8 pp.).

De Boer MJ et al., "Guidelines for etching silicon MEMS structures using fluorine high-density plasmas at cryogenic temperatures," *J. Microelectromech. Sys.* 2002;11(4):385-401.

Eichenfield M et al., "Optomechanical crystals," *Nature* Nov. 5, 2009;462(7269):78-82.

Ekinci KL et al., "Nanoelectromechanical systems," *Rev. Sci. Instrum.* 2005;76:061101 (12 pp.).

Fenton JC et al., "Materials for superconducting nanowires for quantum phase-slip devices," *J. Phys. Conf. Ser.* 2011;286:012024 (2 pp.).

Gierak J et al., "Exploration of the ultimate patterning potential achievable with high resolution focused ion beams," *Appl. Phys. A* 2005;80(1):187-94.

Halbritter J, "Transport in superconducting niobium films for radio frequency applications," *J. Appl. Phys.* 2005;97:083904 (12 pp.).

Henry MD et al., "Ga lithography in sputtered niobium for superconductive micro and nanowires," *Appl. Phys. Lett.* 2014;105:072601 (5 pp.).

Henry MD et al., "Ga$^+$ beam lithography for nanoscale silicon reactive ion etching," *Nanotechnology* 2010;21:245303 (8 pp.).

Henry MD et al., "Ga$^+$ beam lithography for suspended lateral beams and nanowires," *J. Vac. Sci. Technol. B* Nov./Dec. 2010;28(6):C6F26-C6F30.

Henry MD et al., "Hermetic wafer-level packaging for RF MEMs: Effects on resonator performance," *IEEE 62nd Electronic Components and Technology Conference*, held on May 29-Jun. 1, 2012 at San Diego, CA (pp. 362-369).

Henry MD et al., "Silicon nanowire pirani sensor fabricated using FIB lithography," *71st Annual Device Research Conference (DRC)* held on Jun. 23-26, 2013 at Notre Dame, IN (pp. 91-92).

Henry MD et al., "Stress dependent oxidation of sputtered niobium and effects of superconductivity," *J. Appl. Phys.* 2014;115:083903 (9 pp.).

Henry MD, "ICP etching of silicon for micro and nanoscale devices," *Ph.D. dissertation for California Institute of Technology*, May 2010 (219 pp.).

Herr QP et al., "Ultra-low-power superconductor logic," *J. Appl. Phys.* 2011;109:103903 (8 pp.).

Jansen HV et al., "Black silicon method X: a review on high speed and selective plasma etching of silicon with profile control: an in-depth comparison between Bosch and cryostat DRIE processes as a roadmap to next generation equipment," *J. Micromech. Microeng.* 2009;19:033001 (41 pp.).

Kim N et al., "Fabrication of mesoscopic superconducting Nb wires using conventional electron-beam lithographic techniques," *J. Vac. Sci. Technol. B* Jan./Feb. 2002;20(1):386-8.

Lugstein A et al., "FIB processing of silicon in the nanoscale regime," *Appl. Phys. A* 2003;76:545-8.

Mastrangelo CH et al., "Microfabricated thermal absolute pressure sensor with on-chip digital front-end processor," *IEEE J. Solid-State Circ.* 1991;26(12):1998-2007.

Mellhaoui X et al., "SiO$_x$F$_y$ passivation layer in silicon cryoetching," *J. Appl. Phys.* 2005;98:104901 (11 pp.).

Olaya D et al., "Amorphous Nb-Si barrier junctions for voltage standard and digital applications," *IEEE Trans. Appl. Supercond.* Jun. 2009;19(3):144-8.

Qian HX et al., "Fabrication of Si microstructures using focused ion beam implantation and reactive ion etching," *J. Micromech. Microeng.* 2008;18(3):035003 (5 pp.).

Rommel M etal., "Processing of silicon nanostructures by Ga$^+$ resistless lithography and reactive ion etching," *Microelectron. Eng.* 2013;110:177-82.

Rumler M et al., "Evaluation of resistless Ga$^+$ beam lithography for UV NIL stamp fabrication," *Nanotechnology* 2013;24:365302 (8 pp.).

Samaddar S et al., "Niobium-based superconducting nano-device fabrication using all-metal suspended masks," *Nanotechnology* 2013;24:375304 (5 pp.).

Schmidt B et al., "Etch rate retardation of Ga$^+$-ion beam-irradiated silicon," *J. Electrochem. Soc.* 2005;152(11):G875-9.

Schmidt B et al., "Writing FIB implantation and subsequent anisotropic wet chemical etching for fabrication of 3D structures in silicon," *Sens. Actuat. A* 1997;61:369-73.

Sievilä P et al., "The fabrication of silicon nanostructures by focused-ion-beam implantation and TMAH wet etching," *Nanotechnology* 2010;21(14):145301 (6 pp.).

Tachi S et al., "Low-temperature reactive ion etching and microwave plasma etching of silicon," *Appl. Phys. Lett.* 1988;52(8):616-8.

Tettamanzi GC et al., "Superconducting transition in Nb nanowires fabricated using focused ion beam," *Nanotechnology* 2009;20:465302 (5 pp.).

Tholén EA et al., "Nonlinearities and parametric amplification in superconducting coplanar waveguide resonators," *Appl. Phys. Lett.* 2007;90:253509 (3 pp.).

Tolpygo SK et al., "Deep sub-micron stud-via technology of superconductor VLSI circuits," *Supercond. Sci. Technol.* 2014;27:025016 (9 pp.).

Tseng AA, "Recent developments in micromilling using focused ion beam technology," *J. Micromech. Microeng.* 2004;14:R15-34.

Zachariasse JMF et al., "Direct write patterning of titanium films using focused ion beam implantation and plasma etching," *Microelectron. Eng.* 1997;35:63-6.

\* cited by examiner

GALLIUM BEAM LITHOGRAPHY FOR SUPERCONDUCTIVE STRUCTURE FORMATION

CROSS-REFERENCE TO RELATED APPLICATIONS

This application claims the benefit of U.S. Provisional Application Nos. 62/016,038 and 62/016,033, each filed Jun. 23, 2014, each of which is hereby incorporated by reference in its entirety.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to the use of gallium beam lithography to form superconductive structures. Generally, the method includes exposing a surface to gallium to form an implanted region and then removing material adjacent to and/or below that implanted region. In particular embodiments, the methods herein provide microstructures and nanostructures in any useful substrate, such as those including niobium, tantalum, tungsten, or titanium. Additional methods, structures, and uses are described herein.

BACKGROUND OF THE INVENTION

Various methods have been employed to pattern and release microstructures and nanostructures. In particular, CMOS fabrication methods generally include reiterative photolithography steps to selectively pattern, etch, develop, and align functional layers. Such steps are repeated numerous times to provide the desired architecture and usually involve wet chemistry (e.g., use of solvents or solutions that require processing, such as casting, annealing, developing, etc.). Due to such wet chemistry steps, fabrication methods must be carefully designed, so that sensitive components will not be exposed to harsh chemical step or high temperature annealing steps. Additional tools and methods are desired that provide orthogonal fabrication methods. In addition, simplified tools and methods for back-end-of-line processing would be beneficial.

SUMMARY OF THE INVENTION

The present invention relates to a fabrication process for patterning surfaces and substrates. In particular embodiments, the process include low temperature conditions (e.g., at or below about room temperature, such as at or below about 25° C.), dry etching conditions (e.g., without the use of wet chemicals, such as photoresists and their corresponding developers and strippers), and/or low pressure conditions (e.g., less than about 20 mTorr). Such mild conditions will likely not interfere with individual devices present in an integrated circuit (IC), thereby allowing the methods herein to be employed during back-end-of-line processing when such devices are present. Furthermore, the present invention allow any fluorine-etchable substrate (e.g., silicon, germanium, niobium, tantalum, tantalum nitride, tungsten, titanium, nickel, nickel titanium, nickel nitride, nickel silicide, titanium nitride, nickel titanium nitride, etc., and alloys thereof) to be patterned and etched to form superconductive structures.

In some embodiments, the present invention includes an improved method for fabricating a Pirani gauge based on a suspended nanowire of gallium-implanted silicon. The nanowire is made in a two-step process using dry lithography. The steps for fabricating the nanowire can be performed subsequent to the CMOS processing of the wafer. Hence, our gauge can be fabricated with less complexity and less expense than on-chip Pirani gauges of the prior art.

Accordingly, the invention features a method including exposing (e.g., implanting) a region of a surface (e.g., a substrate) with a focused ion beam (e.g., including gallium, aluminum, or any other useful Group III element) so as to define an implanted region; and removing material from regions laterally adjacent to and/or below the implanted region by subtractive etching, thereby releasing a structure from the substrate.

In some embodiments, the exposing step includes rastering the focused ion beam over the region. In some embodiments, the focused ion beam implantation includes a voltage less than about 50 keV.

In some embodiments, the subtractive etching is performed by a dry etching process. In other embodiments, the subtractive etching or dry etching process, if present, is performed at low temperatures (e.g., at or below about 25° C.); under low pressure (e.g., less than about 20 mTorr); and/or in the presence of an etchant and/or a passivation agent (e.g., any described herein). Exemplary etchants include a halogen-based agent (e.g., $SF_6$, $F_2$, $XeF_3$, $NF_3$, $BF_3$, HCl, or HF). Exemplary passivation etchants include a carbon- and fluorine-based agent (e.g., $CF_4$, $C_2F_2$, $C_2F_4$, $C_2F_6$, $C_3F_8$, $C_4F_8$, $C_4F_6$, $C_5F_8$, $CHF_3$, $CH_2F_2$, $CH_3F$, $C_2H_2F_2$) and $O_2$. In yet other embodiments, the etchant further includes an inert gas or another gas (e.g., Ar, $N_2$, and/or $O_2$).

In some embodiments, the subtractive etching or dry etching process, if present, is performed by a fluorine-based inductively coupled plasma reactive ion etch. In other embodiments, the fluorine-based inductively coupled plasma reactive ion etch includes a continuous phase including an etchant and a passivation agent.

In yet other embodiments, the fluorine-based inductively coupled plasma reactive ion etch includes a first phase and a second phase; where the first phase is an anisotropic etch that defines the structure by subtractive etching of surrounding non-implanted material; and where the second phase is an isotropic etch that releases the structure from the substrate.

In some embodiments, the first phase is performed using an etchant (e.g., sulfur hexafluoride, $SF_6$) combined with a passivation agent (e.g., octafluorocyclobutane, $C_4F_8$) as a passivation agent; and the second phase is performed using the etchant without the passivation agent.

In some embodiments, prior to the exposing step, the method includes performing a front end of line (FEOL) process of a semiconductor device on a substrate, thereby providing a surface of the semiconductor device as the surface to be implanted in the exposing step.

In some embodiments, prior to the exposing step, the method includes depositing niobium, tantalum, tungsten, and/or titanium nitride as a film on a substrate, thereby providing the film as a surface (e.g., as the surface to be implanted in the exposing step).

In some embodiments, after the removing step, the method includes eliminating a gallium-rich portion of the implanted region. In particular embodiments, this eliminating step includes use of a plasma etch (e.g., using a gas plasma, such as with Ar or $O_2$) and/or use of a cleanup solution, e.g., am oxidizing mixture (e.g., a Piranha solution including $H_2SO_4$ and $H_2O_2$), a base peroxide mixture (e.g., including $NH_4OH$ and $H_2O_2$), an oxide strip (e.g., including HF), and/or an acid peroxide mixture (e.g., including HCl and $H_2O_2$).

In another aspect, the invention features a superconductive structure including a gallium ion-implanted material and a passivation layer disposed upon at least a portion of a surface of the structure. In some embodiments, the gallium ion-implanted material includes niobium, tantalum, tungsten, and/or titanium nitride.

In other embodiments, the structure includes a microstructure and/or a nanostructure. Exemplary microstructures and nanostructures include a nanowire, a nanobeam, a microwire, a microbeam, a Josephson junction, a waveguide, a resonator, a memristor, a superconducting quantum interference device, a transistor, a single photon edge detector, or a single electron device. In yet other embodiments, the structure includes a back-end-of-line (BEOL) metallization in one or more layers.

In some embodiments, the gallium ion-implanted material includes niobium, niobium nitride, niobium silicide, niobium silicon nitride, niobium aluminum nitride, niobium oxide, niobium titanium, niobium titanium nitride, titanium nitride, tantalum, tantalum oxide, tantalum nitride, tungsten, silicon, germanium, titanium, nickel, nickel titanium, nickel nitride, nickel titanium nitride, nickel silicide, or alloys thereof.

In other embodiments, the passivation layer includes one or more monolayers of a fluorinated film or a perfluorinated film.

In another aspect, the invention features a semiconductor device assembly including: at least one semiconductor device having back end of line (BEOL) metallization in one or more layers; and material deposited in a layer overlying a said BEOL metallization layer, where the overlying layer is conformed as a nanowire Pirani gauge.

In some embodiments, the semiconductor device is a CMOS device or a MEMS device.

In other embodiments, the semiconductor device and the Pirani gauge are sealed within a hermetic package.

In some embodiments, the nanowire Pirani gauge includes a silicon or germanium nanowire ion-implanted with gallium or aluminum. In other embodiments, the nanowire Pirani gauge includes an ion-implanted nanowire having a composition selected from the group consisting of: titanium, tungsten, nickel, nickel titanium, nickel nitride, nickel silicide, tantalum nitride, titanium nitride, and nickel titanium nitride; and the implanted ion is gallium or aluminum.

In another aspect, the present invention features a method for making a semiconductor device assembly including: performing the front end of line (FEOL) processing of a semiconductor device on a substrate; and after the FEOL processing, forming at least one nanowire Pirani gauge (e.g., any described herein) on the substrate.

In particular embodiments, the forming at least one nanowire Pirani gauge includes: implanting a region of the substrate by focused ion beam implantation so as to define an implanted region; and removing material from regions laterally adjacent to and below the implanted region by subtractive etching so as to transform the implanted region into a suspended nanowire.

In further embodiments, the method includes depositing a layer of silicon or germanium, and where the ion beam (e.g., consists substantially of gallium or aluminum) is implanted in the deposited layer.

In other embodiments, the method further includes depositing a layer of metal or metal compound, and where the ion beam (e.g., consists substantially of gallium or aluminum) is implanted in the deposited layer; and where the metal or metal compound is selected from the group consisting of: titanium, tungsten, nickel, nickel titanium, nickel nitride, nickel silicide, tantalum nitride, titanium nitride, and nickel titanium nitride.

In some embodiments, the forming at least one nanowire Pirani gauge includes: depositing a layer of silicon or germanium; implanting the deposited layer by focused ion beam implantation so as to define an implanted region; and removing material from regions laterally adjacent to and below the implanted region by subtractive etching so as to transform the implanted region into a suspended nanowire. In further embodiments, the method includes, after the FEOL processing, depositing at least one back end of line (BEOL) metallization layer; and the layer of silicon or germanium is deposited on the BEOL metallization layer.

In other embodiments, the forming at least one nanowire Pirani gauge includes: implanting a region of the substrate by focused ion beam implantation so as to define an implanted region; and removing material from regions laterally adjacent to and below the implanted region by subtractive etching so as to transform the implanted region into a suspended nanowire, wherein the subtractive etching is performed by a dry etching process at temperatures compatible with FEOL processing. In further embodiments, the subtractive etching is performed by a dry etching process carried out entirely at or below about 25° C.

In some embodiments, the subtractive etching is performed by a fluorine-based inductively coupled plasma reactive ion etch having a first phase and a second phase; the first phase is an anisotopic etch that defines the nanowire structure by subtractive etching of surrounding non-implanted material; and the second phase is an isotropic etch that releases the nanowire from the substrate. In further embodiments, the first phase is performed using sulfur hexafluoride ($SF_6$) as an etchant combined with octafluorocyclobutane ($C_4F_8$) for sidewall passivation; and the second phase is performed using sulfur hexafluoride ($SF_6$) as the etchant without $C_4F_8$ passivation.

In yet another aspect, the invention features an apparatus including a nanowire of ion-implanted silicon suspended on a semiconductor substrate. In examples, the implanted species is gallium or another Group III element, such as aluminum. At least two ohmic contact regions are situated at respective ends of the nanowire, which is configured so that electric current can be injected through it between the ohmic contact regions. The nanowire is further configured for detecting changes in its current-voltage characteristic in response to pressure changes.

In some embodiments, the nanowire is at least 50 times (e.g., at least 100 times) as long as it is wide and/or has a footprint of no more than one squared micrometer.

In some embodiments, the apparatus further includes two voltage probes that contact the nanowire at respective intermediate points along the length of the nanowire, where each of the two voltage probes is a further gallium-implanted silicon nanowire.

In yet another aspect, the present invention features a method including forming an integrated circuit or MEMS device by CMOS processing of a semiconductor substrate;

then implanting gallium into a silicon region of the substrate by focused ion beam implantation so as to define a substantially rectangular implanted region; and removing silicon from regions laterally adjacent to and below the implanted region by subtractive etching so as to transform the implanted region into a suspended nanowire, where the implantation is carried out with a dose and an implant voltage that are selected to produce a nanowire having a current-voltage characteristic with a desired sensitivity to pressure.

Some implementations of the subtractive etching process can involve completely dry etching. That is, no solvents or liquid developers were used. Moreover, we performed our subtractive etching at low temperatures, i.e., temperatures less than about 25° C. This was significant because this low temperature range is compatible with back-end-of-the-line (BEOL) fabrication processes.

Notably, our fabrication process described herein is not limited to planar lithography. That is, the process is suitable for forming the nanowire not only on the upper face of a planar substrate, but also on side walls and on suspended structures, among other things. This characteristic of our process is especially advantageous in the context of wafer-level packaging technology and various three-dimensional IC technologies such as interposer technology.

In further embodiments, the fabrication process permits a range of sizes for the nanowire from about 25 nm width to widths of tens of micrometers.

In some embodiments, the method includes performing a CMOS process flow leading to the fabrication of an integrated circuit on a silicon or SOI substrate, and then performing the steps enumerated herein leading to the fabrication of the suspended nanowire on the same substrate.

In another aspect, the present invention includes a system including an integrated circuit fabricated on a silicon or SOI substrate, and a Pirani gauge fabricated on the same substrate.

In any embodiment herein, the implanted region includes niobium, tantalum, tungsten, and/or titanium nitride.

In any embodiment herein, the surface includes a layer of a metal or metal compound deposited on a semiconductor substrate. For example, the metal or metal compound is selected from the group of niobium, niobium nitride, niobium silicide, niobium silicon nitride, niobium aluminum nitride, niobium oxide, niobium titanium, niobium titanium nitride, titanium nitride, tantalum, tantalum oxide, tantalum nitride, and alloys thereof.

Definitions

As used herein, the term "about" means +/−10% of any recited value. As used herein, this term modifies any recited value, range of values, or endpoints of one or more ranges.

By "microstructure" or "micro" is meant having at least one dimension that is less than 1 mm. For instance, a microstructure (e.g., any structure described herein) can have a length, width, height, thickness, cross-sectional dimension, circumference, radius (e.g., external or internal radius), or diameter that is less than 1 mm.

By "nanostructure" or "nano" is meant having at least one dimension that is less than 1 µm. For instance, a nanostructure (e.g., any structure described herein) can have a length, width, height, thickness, cross-sectional dimension, circumference, radius (e.g., external or internal radius), or diameter that is less than 1 µm.

As used herein, the terms "top," "bottom," "upper," "lower," "above," and "below" are used to provide a relative relationship between structures. The use of these terms does not indicate or require that a particular structure must be located at a particular location in the apparatus.

Other features and advantages of the invention will be apparent from the following description and the claims.

DETAILED DESCRIPTION OF THE INVENTION

The present invention relates to lithography methods including a focused ion beam (FIB) to implant one or ions. In particular, the methods herein allow for a substrate or a film disposed on the substrate to be implanted (e.g., with a pattern) and etched, thereby releasing one or more microstructures and/or nanostructures.

In general, the methods herein include gallium implantation of a surface, which provides an implanted region. In some embodiments, the gallium is delivered in a highly collimated ion beam with a very narrow beam waist and low implantation fluence. A raster controls the shape of the implanted region, which in typical cases is substantially rectangular, i.e. rectangular except for small scattering effects at the ends. It should also be noted that possible alternatives to gallium as the implanted species are also included within the scope of the present invention. Such possible alternatives include aluminum and other Group III elements.

Figure 1A:
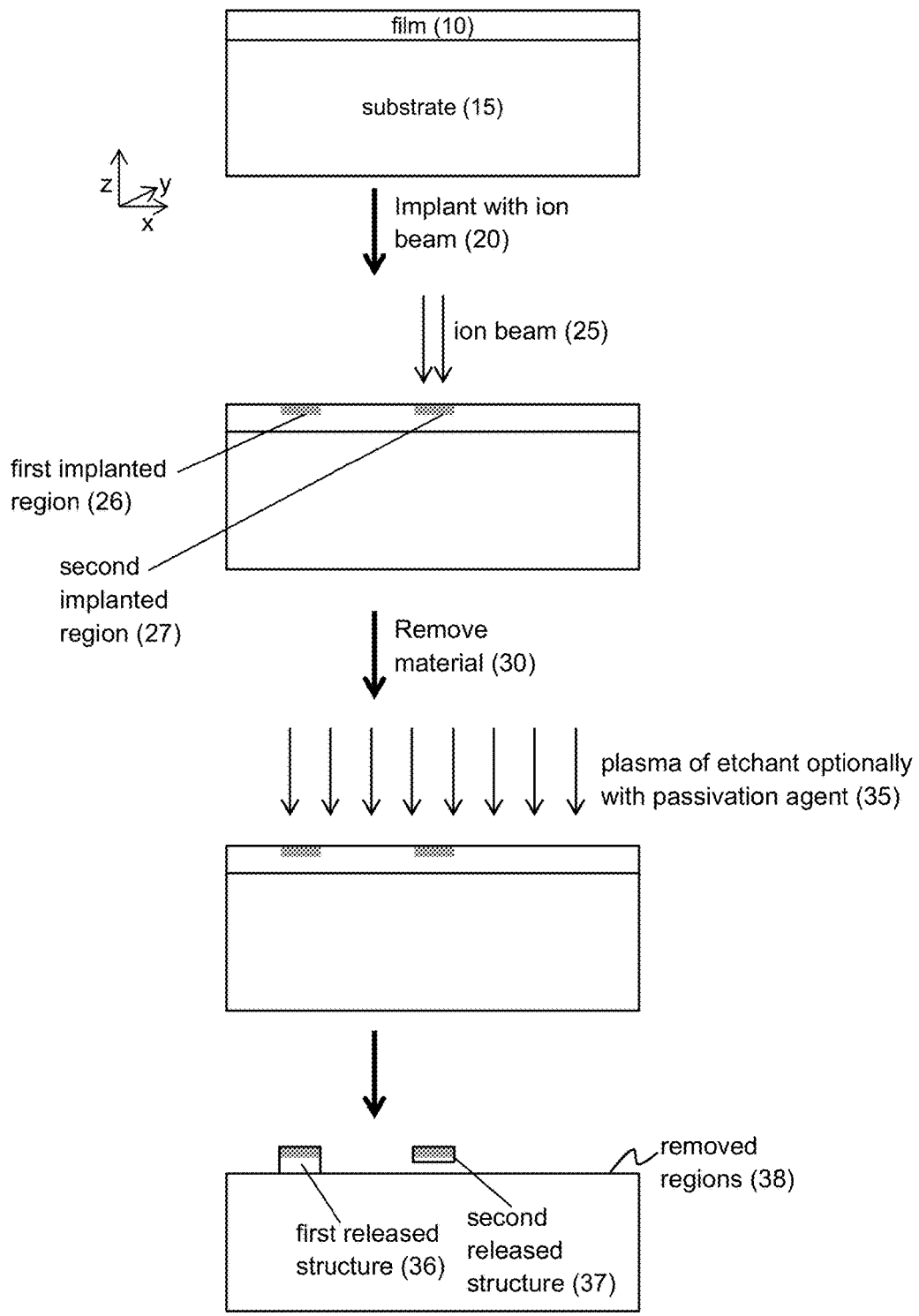
FIG. 1A-1C provides flowcharts and a schematic of exemplary processes for making a microstructure or nanostructure according to an embodiment of the present invention.

Then, the surface is etched with an etchant that preferentially removes material surrounding the implanted region rather than the implanted region. FIG. 1A provides a schematic of one exemplary process.

As can be seen, the surface can include a thin film 10 deposited on a substrate 15. Alternatively, the surface can include only a substrate. When a film is present, any of the materials herein (e.g., a niobium, tantalum, tungsten, and/or titanium nitride, as well as materials containing any of these) can be deposited using any useful method. Exemplary methods include sputter deposition, vapor deposition (e.g., chemical vapor deposition), vacuum deposition, plating, atomic layer deposition, etc., as well as any methods described in Henry M D et al., "Stress dependent oxidation of sputtered niobium and effects of superconductivity," *J. Appl. Phys.* 2014; 115:083903 (9 pp.) and Mastrangelo C H et al., "Microfabricated thermal absolute pressure sensor with on-chip digital front-end processor," *IEEE J. Solid-State Circ.* 1991; 26(12):1998-2007, each of which is incorporated herein by reference in its entirety.

Then, the surface is implanted 20 with an ion beam 25, such as a gallium ion beam. Various parameters of the ion beam can be optimized to provide the desired implant depth, implant width, implant dose, and/or beam waist. Typical focused ion beam (FIB) tools have variable implant voltage and variable beam currents. The beam voltage directly controls the implant depth, straggle, skewness, and kurtosis, whereas the beam current controls implant rate and beam waist. The areal implant dose is a function of the implant time, the beam current, and the ion-beam scanning area. The implanted concentration profile is inferred from the areal dose according to known implant models (e.g., TRIM). The maximum areal dose of gallium is generally limited by the solid solubility of gallium in the substrate material or film material.

The areal implant dose determines the maximum depth that can be achieved in the subsequent etching process, which is described in detail below. According to simple estimates, most of the implanted gallium is contained within a 20 nm band buried about 25 nm below the surface. In one embodiment, the first phase of the etching process is a highly anisotropic reactive ion etch that is masked by the implanted gallium layer. Ideally, the geometrical footprint defined by the implanted region can be maintained indefinitely while the surrounding non-implanted region is removed to arbitrary depth, leaving a mesa of arbitrary height with vertical walls.

In practice, however, the implantation mask will eventually be eroded by the plasma etchant, and spatial selectivity will consequently be lost. If the concentration of implanted gallium is high enough, the etchant will mill the implanted region away at a rate (typically, about 5 nm/minute) that is substantially lower than the volatile etch rate (typically, about 400 nm/minute) of the surrounding non-implanted region. Another possible limit on spatial selectivity is due to beam straggle, which broadens the edge of the implanted region.

The ultimate limits on spatial resolution come from a combination of lateral straggle, beam width, and etch conditions. Straggle is predictable and beam width can be measured, but the effect of etch conditions on spatial resolution is hard to predict with high precision.

Accordingly, exemplary useful parameters for implantation include raster scan rate, raster overlap (e.g., a percentage overlap of the beam, such as 50% overlap), beam current (e.g., in order to determine the beam waist, such as a current of less than about 20 pA or more than about 500 pA), accelerating voltage (e.g., less than about 50 keV), implant area, dwell time, and/or bias power (e.g., more than about 10 mW). Methods for optimizing such parameters include use of simulations employing Stopping and Range of Ions in Matter (SRIM/TRIM), as well as any methods described in Henry M D, "ICP etching of silicon for micro and nanoscale devices," *Ph.D. dissertation for California Institute of Technology*, May 2010, 219 pp., which is incorporated herein by reference in its entirety.

The ion beam can be, e.g., FIB, which can be used to pattern the surface with any useful arrangement. Any useful write programs can be used to specify the desired pattern onto the surface. For instance, the pattern can include one or more implanted regions 26, 27 extending any useful implant depth in the z-direction, as well as having any useful dimensions in the x- and/or y-directions. The depth of the implanted region is determined by, e.g., the ion beam voltage. One result of the implantation is to render the (initially crystalline) material amorphous in the implanted region.

Then, the surface is exposed to a plasma 35 to remove material 30 surrounding the implanted regions 26, 27. The plasma can include any useful agents to facilitate etching (e.g., anisotropic etching) and/or release of the desired structure. For instance, the agent can include an etchant, such as, for example and without limitation, a halogen-containing etchant (e.g., $SF_6$, $F_2$, $XeF_3$, $NF_3$, $BF_3$, HCl, or HF, as well as any other useful fluorine- or chlorine-containing etchant). In particular non-limiting embodiments, the etchant is chosen to be an agent that releases an ion (e.g., a fluorine or chlorine ion) that impinges a surface and reacts with the surface to produce a volatile substance, thereby removing material from the regions that have not been ion implanted (i.e., non-implanted regions). Etching conditions and agents are described in U.S. Pat. Nos. 8,557,613 and 8,557,612, as well as Henry M D, "ICP etching of silicon for micro and nanoscale devices," *Ph.D. dissertation for California Institute of Technology*, May 2010, 219 pp., each of which is incorporated herein by reference in its entirety.

In another instance, a passivation agent can be included in this removing step. In particular embodiments, the passivation agent is a carbon- and fluorine-containing agent, such as, e.g., $CF_4$, $C_2F_2$, $C_2F_4$, $C_2F_6$, $C_3F_8$, $C_4F_8$, $C_4F_6$, $C_5F_8$, $CHF_3$, $CH_2F_2$, $CH_3F$, or $C_2H_2F_2$. Such agents include a polymerizable group (e.g., $-CF_2-$, $-CFH-$, or $-CH_2-$), which results in the deposition of a polymer-containing passivation layer (e.g., a fluorinated or perfluorinated film) on at least a portion of the boundary between the implanted region and the non-implanted region. In particular embodiments, the removing step includes at least an etchant and a passivation agent. Methods of characterizing and depositing passivation layers are described in Mellhaoui X et al., "$SiO_xF_y$ passivation layer in silicon cryoetching," *J. Appl. Phys.* 2005; 98:104901 (11 pp.) and Henry M D, "ICP etching of silicon for micro and nanoscale devices," *Ph.D. dissertation for California Institute of Technology*, May 2010, 219 pp., each of which is incorporated herein by reference in its entirety.

Various experimental parameters of the removing step can be optimized in order to provide the desired microstructure and/or nanostructure. For example, the structure can include a standing structure (e.g., the first released structure 36) or an undercut structure (e.g., the second release structure 37). As can be seen, any useful portion 38 of the surface can be removed. The removing step can include any useful process, such as a reactive ion etch, e.g., an inductively coupled plasma reactive ion etch. The plasma etch can have any useful power, voltage, bias power (e.g., greater than about 10 W, 15 W or 20 W), flow rate of etchant and/or passivation agent (e.g., between about 30 to about 200 sccm), reaction time (e.g., less than about 5 minutes, 4 minutes, 3 minutes, 2 minutes, 1.5 minutes, or 1 minute), chamber temperature (e.g., at or below about 25° C.), and/or chamber pressure (e.g., less than about 30 mTorr, 20 mTorr, or 10 mTorr). Additional parameters are described in U.S. Pat. Nos. 8,557,613 and 8,557,612, as well as Henry M D, "ICP etching of silicon for micro and nanoscale devices," *Ph.D. dissertation for California Institute of Technology*, May 2010, 219 pp., each of which is incorporated herein by reference in its entirety.

Figure 1B:
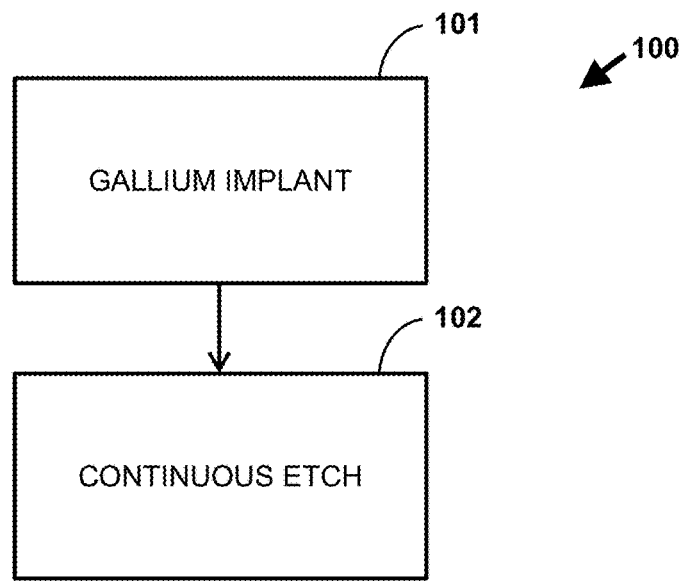

The removing step can include one or more etch processes. For example, as shown in FIG. 1B, one exemplary method 100 includes a gallium implant 101, followed by a continuous etch 102. The continuous etch can include any useful etchant optionally combined with a passivation agent, where the etch is conducted under one continuous experimental condition.

Figure 1C:
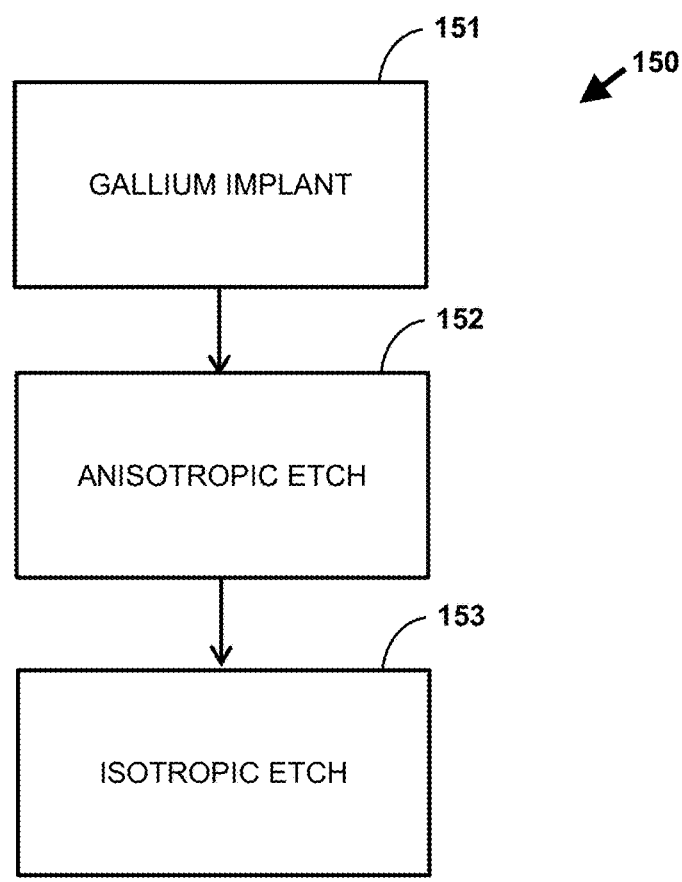

As shown in FIG. 1C, another exemplary method 150 includes a gallium implant 151, followed by two phases: an anisotropic etch 152 and an isotropic etch 153. These two phases can be alternated for any number of useful cycles to obtain the desired microscale or nanoscale dimensions. In the first phase 152, a highly anisotropic fluorine-based inductively coupled plasma reactive ion etch can be used to define the structure by subtractive etching of the surrounding non-implanted material. Then, in the second phase 153, the etch parameters are changed so that the etch becomes isotropic. This phase can result in the release of the microstructure or nanostructure from the substrate, rendering it ready for use. In typical trials involving multiple simultaneous writes, the implantation write time for a nanowire of width 100 nm, thickness (in the depth direction) 20 nm, and length 10 μm was 100 ms; and the etch time was 160 seconds.

It should be noted that the lithographic technique described above does not require planar surfaces, and it can be performed subsequent to the CMOS processing of an IC wafer.

The present invention includes methods for fabricating any useful structure, including any that gauge or sensor (e.g., pressure gauges, such as Pirani gauges, temperature gauges, corrosion sensors, etc.) for use in back-end-of-line (BEOL) fabrication of an IC package (e.g., a hermetic IC package). Exemplary structures include a nanowire, a nanobeam, a microwire, a microbeam, a Josephson junction, a waveguide, a resonator, a memristor, a superconducting quantum interference device, a transistor, a single photon edge detector, a Pirani gauge, or a single electron device (e.g., a single electron transistor or a single electron tunneling device).

It is notable that the process (e.g., the etch) can be performed at low temperatures, e.g., temperatures less than 400° C., and even can be performed at 25° C. or even less. Consequently, the fabrication of one or more microstructures and/or nanostructures can be performed on a substrate, e.g., on a die or wafer, after a CMOS process flow has been applied to the same substrate, for example to fabricate an integrated circuit or MEMS device.

The structures can have any useful components. For example, a metallization layer such as the top CMOS metal layer can be patterned for signal routing. Then, a material layer (e.g., as a thin film) can be deposited over the metal. Then, the material layer can be patterned, as described above using ion beam implantation, to form one or more microstructures and/or nanostructures. Examples of appropriate techniques for depositing the material are PECVD, HDCVD, and sputter deposition.

More generally, the material layer for the microstructures and/or nanostructures can be deposited at any time during the CMOS process flow, or it can be done later, e.g., at BEOL fabrication. For temperature compatibility, e.g., to avoid thermal modification of transistors, metal features, and the like, BEOL deposition can be carried out below 400° C.

Although it will generally be advantageous to deposit the material over a patterned metal layer, it should be noted that in an alternative procedure, the material can be deposited first, followed by deposition and patterning of the metal, followed by patterning of the microstructures and/or nanostructure.

It should also be noted that the etching of the microstructures and/or nanostructures can be performed at the level of an individual die, or alternatively it can be performed at wafer level. For example, the ion implant can be done at wafer level, followed by dicing of the wafer, etching at the die level to release the microstructures and/or nanostructures, and then packaging the individual dies.

EXAMPLES

Example 1: $Ga^+$ Lithography in Sputtered Niobium for Superconductive Micro and Nanowires This example describes the use of FIB implanted Ga as a lithographic mask for plasma etching of Nb films. Using a highly collimated Ga beam of a FIB, Nb was implanted 12 nm deep with a 14 nm thick Ga layer providing etch selectivity better than 15:1 when etching using fluorine based etch chemistry. Implanted square test patterns, both 10 μm×10 μm and 100 μm×100 μm, demonstrated that doses above $7.5 \times 10^{15}$ cm$^{-2}$ at 30 keV provided adequate mask protection for a 205 nm thick, sputtered Nb film. The resolution of this dry lithographic technique was demonstrated by fabrication of nanowires 75 nm wide by 10 μm long connected to 50 μm wide contact pads. The residual resistance ratio of patterned Nb films was 3. The superconducting transition temperature, $T_c$=7.7 K, was measured using MPMS®. Given the selectivity demonstrated this nanoscale, dry lithographic technique could be extended to other fluorine-etchable superconductors, such as NbN, NbSi, NbTi, TiN, and Ta, as well as any other useful substrate or surface (e.g., any described herein).

Niobium continues to demonstrate its value as a low temperature superconductor (LTS) in fabrication of superconductive electronics, Josephson junction research, coplanar waveguides and resonators, and fundamental work in nanostructures (Herr Q P et al., "Ultra-low-power superconductor logic," J. Appl. Phys. 2011; 109:103903 (8 pp.); Crotty P et al., "Josephson junction simulation of neurons," Phys. Rev. E 2010; 82:011914 (8 pp.); Olaya D et al., "Amorphous Nb—Si barrier junctions for voltage standard and digital applications," IEEE Trans. Appl. Supercond. 2009 June; 19(3):144-8); Tholén E A et al., "Nonlinearities and parametric amplification in superconducting coplanar waveguide resonators," Appl. Phys. Lett. 2007; 90:253509 (3 pp.); Samaddar S et al., "Niobium-based superconducting nano-device fabrication using all-metal suspended masks," Nanotechnology 2013; 24:375304 (5 pp.); and Fenton J C et al., "Materials for superconducting nanowires for quantum phase-slip devices," J. Phys. Conf Ser. 2011; 286:012024 (2 pp.)).

Patterning of structures in niobium films requires the combination of defining a mask and then etching unwanted niobium away, where fidelity and ultimate resolution of the pattern become descriptive parameters. Typically, patterning is performed using photolithography or electron beam lithography to define a resist mask and etching is achieved using a reactive ion etching system. Photolithography can pattern in the micron to slightly submicron regimes and the electron beam lithography can extend deep into the nanoscale (see, e.g., Tolpygo S K et al., "Deep sub-micron stud-via technology of superconductor VLSI circuits," Supercond. Sci. Technol. 2014; 27: 025016 (9 pp.); and Kim N et al., "Fabrication of mesoscopic superconducting Nb wires using conventional electron-beam lithographic techniques," J. Vac. Sci. Technol. B 2002 January/February; 20(1):386-8).

Alternatively, tools such as focused ion beams (FIBs) permit directly milling away of material using Ga ion beams, although damage to the niobium surfaces and sidewalls can occur during ion impingement. Milling a pattern can be a slow process for high resolution features (see, e.g., Tettamanzi G C et al., "Superconducting transition in Nb nanowires fabricated using focused ion beam," Nanotechnology 2009; 20:465302 (5 pp.); and Lugstein A et al., "FIB processing of silicon in the nanoscale regime," Appl. Phys. A 2003; 76:545-8).

Here, we demonstrate using the FIB to implant a thin Ga layer to be used as a lithographic etch mask, rather than using it as a milling tool. The FIB offers the ability to implant a Ga pattern, using beam waists in the single nanometer ranges, where the implanted Ga can serve as an etch stop to low biased, fluorine-based plasma etch chemistries. Implantation created a shallow damage layer on the surface of the niobium thin film (e.g., about 14 nm thick). However, the sides of the etched niobium structure remained relatively damage free. The loss of the top 14 nm becomes insignificant when considering that the top 10 nm niobium surface is covered with a nonconductive oxide, $Nb_2O_3$ or $NbO_x$ (Halbritter J, "Transport in superconducting niobium films for radio frequency applications," J. Appl. Phys. 2005; 97:083904 (12 pp.)).

Although the technique of Ga lithography has been previously demonstrated to create structures in silicon down to the nanometer regime, here we demonstrate the feasibility of extending the technique to superconductive metal films (Henry M D et al., "Ga$^+$ beam lithography for suspended lateral beams and nanowires," J. Vac. Sci. Technol. B 2010 November/December; 28(6):C6F26-C6F30; Böttger R et al., "Characterization of Si nanowires fabricated by Ga' FIB implantation and subsequent selective wet etching," J. Micromech. Microeng. 2011; 21:095025 (8 pp.); Rommel M et al., "Processing of silicon nanostructures by Ga$^+$ resistless lithography and reactive ion etching," Microelectron. Eng. 2013; 110:177-82; and Henry M D et al., "Ga$^+$ beam lithography for nanoscale silicon reactive ion etching," Nanotechnology 2010; 21:245303 (8 pp.), each of which is incorporated herein by reference in its entirety).

Here, we used sputtered deposited niobium on a thermal silicon dioxide coated, 150 mm silicon wafer. The niobium was Ar sputter deposited using a Denton Discovery 550 deposition tool with a room temperature stage and a chamber pressure at 4.8 mTorr. Various film measurements included a tensile strain of approximately 840 MPa, a thickness of 205 nm, and a room temperature resistivity of 20.2 μOhm-cm. In previous work, this thin film demonstrated oxidation that was confined to the top 10 nm of the film with no diffusion into the bulk Nb and displayed a $T_c$ of up to 8.3 K (Henry M D et al., "Stress dependent oxidation of sputtered niobium and effects of superconductivity," J. Appl. Phys. 2014; 115:083903 (9 pp.)).

Figure 2:
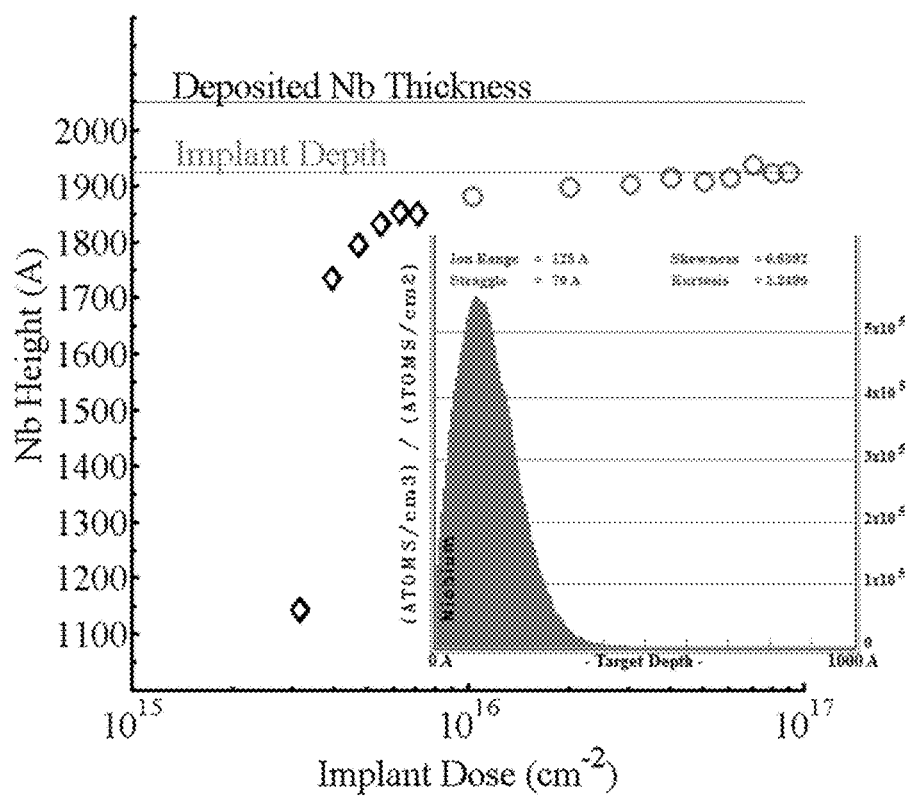
FIG. 2 is a graph showing niobium (Nb) film height versus implant dose ($cm^{-2}$). A Nb film was sputtered deposited to a 2050 Å thickness on silicon dioxide. (Inset) After a Ga ion implant to 125 Å deep, an ion straggle of 70 Å created the 14 nm thick etch mask as calculated by TRIM. A fluorine-based plasma etch was then performed for 90 seconds. The final Nb thickness was measured by a profilometer and compared with the implant dose.

The wafer was then cleaved into samples, approximately 1 cm×2 cm, and loaded into a FEI NOVA 600 FIB. The FIB was then used to write a pattern onto the niobium film using Ga ions accelerated at 30 kV using various beam currents which were chosen with regard to the dose and beam waist requirements. Implant depth and thickness were controlled by the magnitude of the beam voltage, where a higher beam voltage implanted deeper with a larger straggle. Ga layer thickness was approximated here as twice the vertical straggle, and the Ga density was the areal dose multiplied by the ion range distribution. This distribution was simulated using TRIM (Transport of ions in matter) (FIG. 2, inset). At 30 keV, the Ga implants about 12.5 nm deep into the niobium film with a thickness of 14 nm. The implant dose was controlled by both the beam current (BC) and the dwell time of the beam (t):

$$\text{Dose} = \frac{BC \times t}{10^4 \times q \times A},$$

where q is electron charge and A is the implant area. At areal doses in the mid $10^{17}$ cm$^{-2}$ level, significant sputtering of the niobium film began to occur (Rommel M et al., Microelectron. Eng. 2013; 110:177-82).

The samples were submounted to a 150 mm carrier wafer and etched in a Plasma Therm inductively coupled plasma reactive ion etcher (ICP RIE). The plasma etch was set similar to that of a mixed mode Bosch silicon etch, where the ICP was at 900 W, bias power was at 15 W, and $SF_6$ and $C_4F_8$ were flowed into the chamber at 50 and 90 sccm, respectively, for a chamber pressure of 10 mTorr. This chemistry created a fluorine rich plasma environment, which anisotropically etches the niobium film with minimal contribution from milling. The thin Ga layer then served as an etch mask, protecting the niobium film below it. The mechanism for Ga providing the protection, is attributed to fluorine bonding to gallium creating a nonvolatile layer; similar to what is seen when masking silicon (Böttger R et al., *J. Micromech. Microeng.* 2011; 21:095025 (8 pp.)). Hence, removal of this thin Ga film is attributed only to the milling action from ions generated during etch.

The selectivity of the Ga film was controlled by both the density of the implanted layer (determined by the areal dose and solid solubility of Nb) and the etch conditions. By increasing the areal dose, the etch mask can be made to better protect the niobium layer (FIG. 2).

To determine the minimum areal dose to pattern a 200 nm thick niobium films, under the before mentioned etch conditions, sets of squares were patterned with varying doses and etched for 90 seconds. The first pattern was a set of nine 10 μm×10 μm squares implanted with areal doses starting at $1\times10^{16}$ $cm^{-2}$ and increasing in $1\times10^{16}$ $cm^{-2}$ steps (FIG. 2, circles) using a 0.92 nA beam current. The employed write speed created an implanted square at the dose rate of 1.8 seconds per $1\times10^{16}$ $cm^{-2}$ areal dose implanted.

Figure 3:
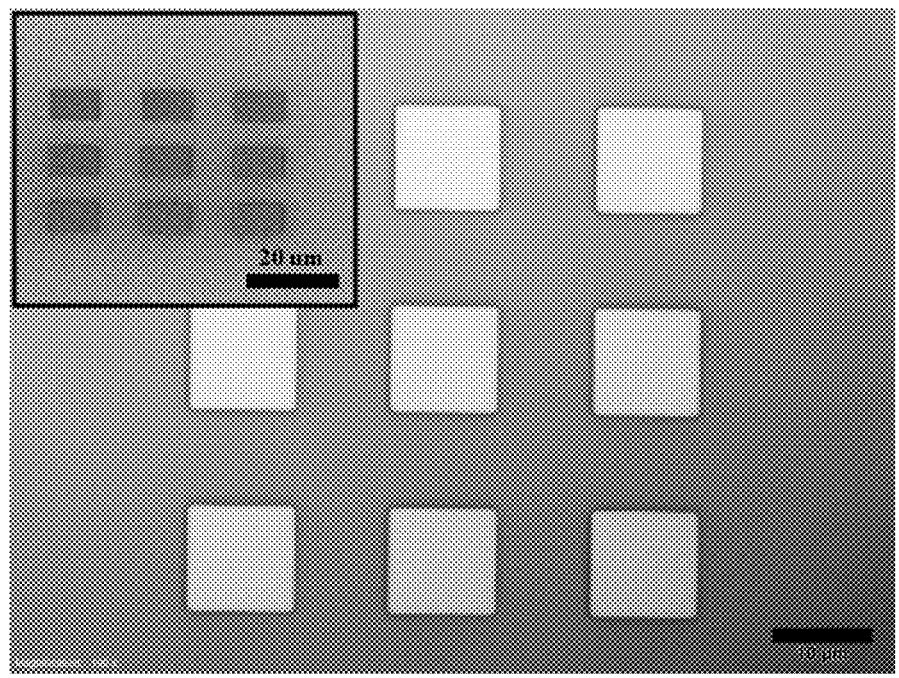
FIG. 3 shows a lithographic pattern created using a focused ion beam (FIB) to implant Ga into the Nb thin film. The larger optical microphotograph shows a set of 10 µm×10 µm squares composed of an Nb layer (white regions) after a fluorine-based plasma etch removes unwanted Nb, thereby revealing the bottom thermal oxide layer (gray regions); scale bar 10 µm. (Inset) An SEM image depicts a set of nine 10 µm×10 µm squares implanted with a dose stepped by $1\times10^{16}$ $cm^{-2}$; scale bar is 20 µm.

The second pattern implanted used a 21 nA beam current to create 100 μm×100 μm squares with doses starting at $2.5\times10^{15}$ $cm^{-2}$ stepped at $2.5\times10^{15}$ $cm^{-2}$ increments (FIG. 2, diamonds). The write speed for these larger squares was 1.9 seconds per $2.5\times10^{15}$ $cm^{-2}$. Ga implanted patterns in niobium were observed in the FIB post implantation using SEM (FIG. 3, inset) or optically to permit confirmation of the implantation. Profilometer measurements of the niobium film (after 90 seconds of etch) showed a step height consistent to the mean simulated implantation depth. This indicated that niobium below the implant was protected for doses above $2\times10^{16}$ $cm^{-2}$ areal doses.

Figure 4A:
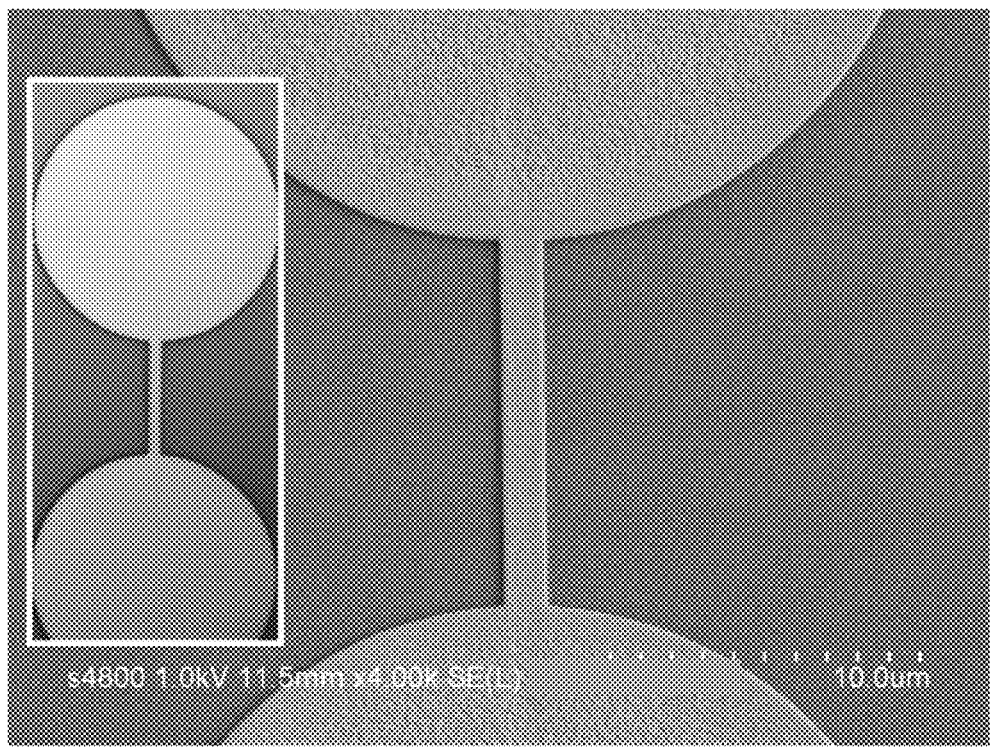
FIG. 4A-4B shows nanoscale and microscale structures that were lithographically patterned using an exemplary method of the invention. Provided are images of (A) a microwire that is 1.5 µm wide and 10 µm long, where an optical image (inset) shows the 1.5 µm wire connected to 50 µm diameter contact pads; and (B) a nanowire that is 75 nm wide and 10 µm long, where an optical image (inset) shows the nanowire connected to 50 µm diameter contact pads. Different components can be formed using any useful parameters for the ion beam. For instance, the nanowire was patterned using a 1.5 pA beam current having a 5 nm beam waist, whereas the larger contact pads were patterned using a 21 nA beam current having a 137 nm beam waist). The samples were both etched in an ICP RIE using $SF_6$ and $C_4F_8$ plasma for 90 seconds.

For doses less than $2\times10^{16}$ $cm^{-2}$, the lithographic pattern failed, and niobium under the pattern began to etch. The resulting etched 10 μm niobium squares were displayed (FIG. 3) with a measurement of fidelity to about 99%, defined here as the ratio of actual pattern to lithographically desired pattern. By rastering the Ga beam with a 50% overlap in both x- and y-directions during the implant, the masked field was approximated as being fully implanted to the calculated dose. To create a micron scaled wire, two 50 μm diameter circles were implanted using the 0.92 nA beam current. A 1 μm×10 μm rectangle connecting the two circles was then implanted with the areal dose set to $5\times10^{16}$ $cm^{-2}$. The structure was then etched for 90 seconds creating a microwire with two probe contact pads (FIG. 4A).

Figure 4B:
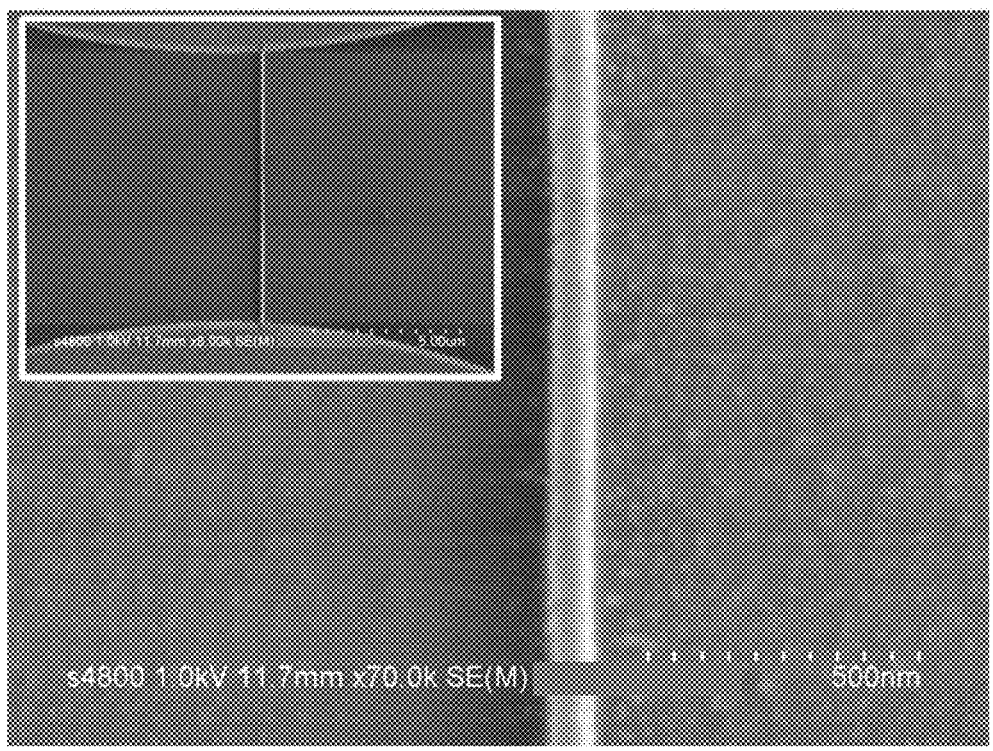

Although lithography at the micro scale was demonstrated with the squares and micro wires, pushing the lithography technique into nanoscale regimes was also desired. This required a minimization of beam current to achieve a minimum beam waist. For nanoscale structures, the Ga beam current was reduced to 1.5 pA, resulting in a 5 nm beam waist, and used to implant a 10 μm long by 50 nm wide rectangle implanted to a $4\times10^{16}$ $cm^{-2}$ dose. Without moving the stage, a higher beam current of 21 nA was used to implant two 50 μm diameter circles on both ends of the rectangle to serve as contact pads. The sample was etched, resulting in a Nb nanowire that was 75 nm wide and 10 μm long, as well as connected to contact pads (FIG. 4B).

For further reduction in wire width, we speculated that increased etch bias powers and/or reduced implantation voltage should improve fidelity and reduce feature size to that of the Nb grain size. It is worth noting that lateral straggle at 30 keV for Ga into Nb was 5.4 nm, whereas a 5 keV beam would have a 1.9 nm lateral straggle. Analogous to electron beam lithography, beam currents in the FIB can be adjusted to trade beam write times with feature size resolution.

Implanting Ga was noted to damage the surface of the Nb thin film. To ensure that the superconductive properties of the film were not impacted, two experiments were conducted. The first experiment created contact pad structures with wires (100 μm wide and 500 μm long) using Ga beam lithography (to provide a Ga-implanted sample) or patterned Az 5214e photoresist (to provide a resist-masked sample). These two samples were fabricated on the same Nb wafer and etched at the same time. The resist-masked sample was cleaned in acetone and isopropanol. The samples were then cryogenically cooled in a Lakeshore cryostat and measured using a Keithley 2400 source meter at 272 K and 10 K. The Ga-implanted sample had a residual resistance ratio (RRR) of 2.8, and the resist-masked sample had a RRR of 3.2.

Figure 5:
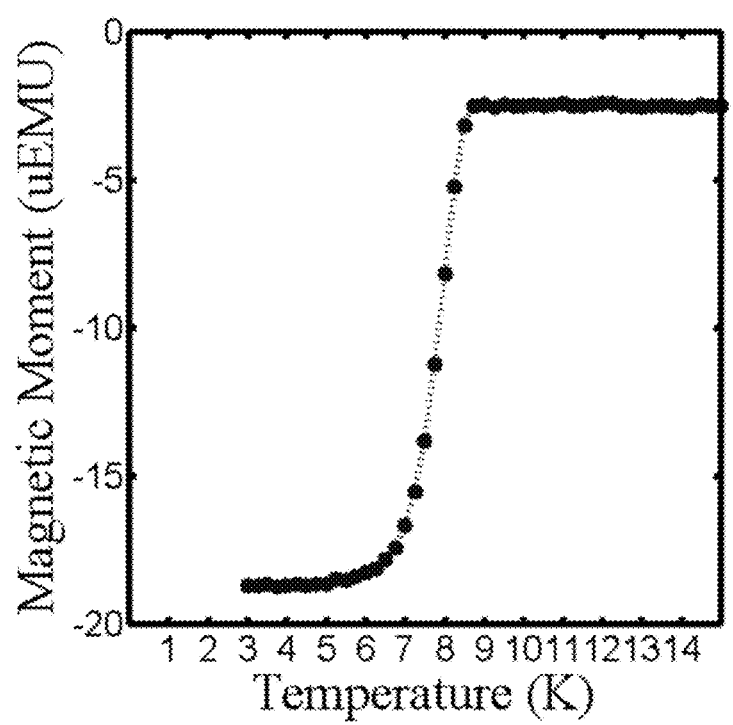
FIG. 5 is a graph showing the superconducting transition $T_c$ for a $Ga^+$ patterned device. was measured using a magnetic property measurement system (MPMS®) at 10 Oe zero field cooled. A 300 µm square, which was $Ga^+$ patterned and etched, demonstrated a superconductive transition $T_c$ at 7.75 K.

In a second experiment, $T_c$ was also measured to understand the effect of Ga implantation on superconductivity of the fabricated structure. Here, a 300 μm square was implanted to $5\times10^{16}$ $cm^{-2}$ and etched. The sample was then placed in a Quantum Designs MPMS® tool and measured (zero field cooled with 10 Oe field) to determine the superconductive transition ($T_c$) (FIG. 5). A very good transition occurs at 7.75 K+/−0.25K. For comparison, a resist-masked structure using the same Nb thin film deposition process and etch was measured to have a $T_c$ at 7.6K+/−0.2 K. The RRR and $T_c$ measurements suggested that implantation causes little damage to the bulk Nb film.

Under similar etch conditions that rely on fluorine, such as $SF_6$ and Ar or $NF_3$, we predict that other superconductive thin films such as TiN, NbSi, NbN, NbTiN, or any herein, could be similarly patterned and etched to achieve micro and nanoscale structures while maintaining superconductive properties. For Ga mask removal, it is likely a plasma Ar etch of the Nb surface or wet clean such as SC-1 would adequately remove the etch mask.

In summary, we have discussed a technique using FIB lithography and fluorine-based etch chemistry to write and pattern deep sub-micron features on Nb thin films. Ga doses above $2\times10^{16}$ $cm^{-2}$ provided an effective etch mask with etch selectivity better than 15:1. Patterned Nb films demonstrated a $T_c$ of 7.7 K, indicating minimal damage occurred during Ga implant. Features as small as 70 nm were shown.

Example 2: $Ga^+$ Lithograph of Ta and TiN

Figure 6:
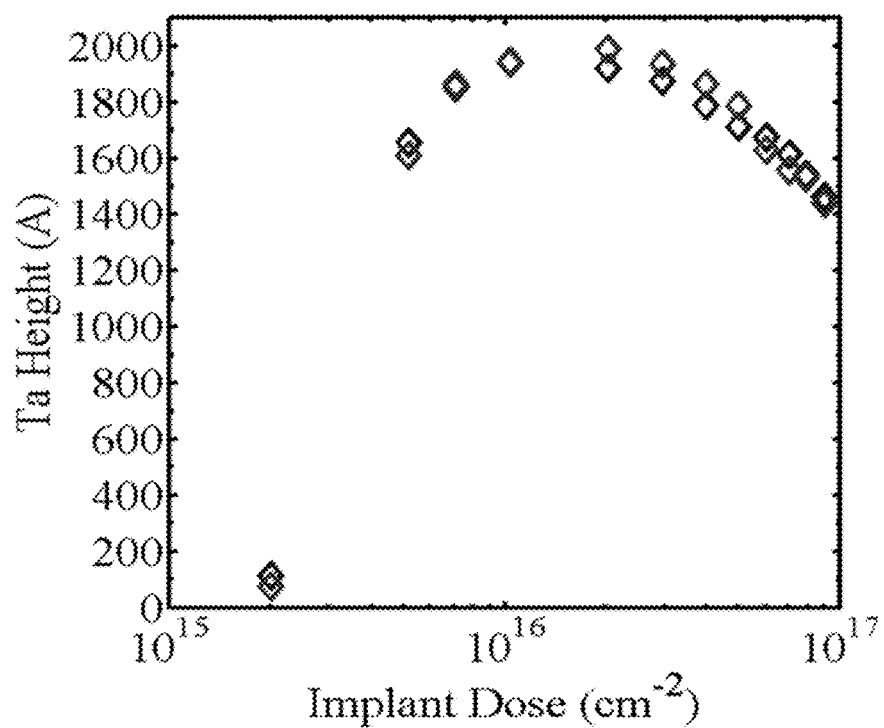
FIG. 6 is a graph showing tantalum (Ta) film height versus implant dose ($cm^{-2}$). The final Ta thickness was measured by a profilometer and compared with the implant dose.
Figure 7:
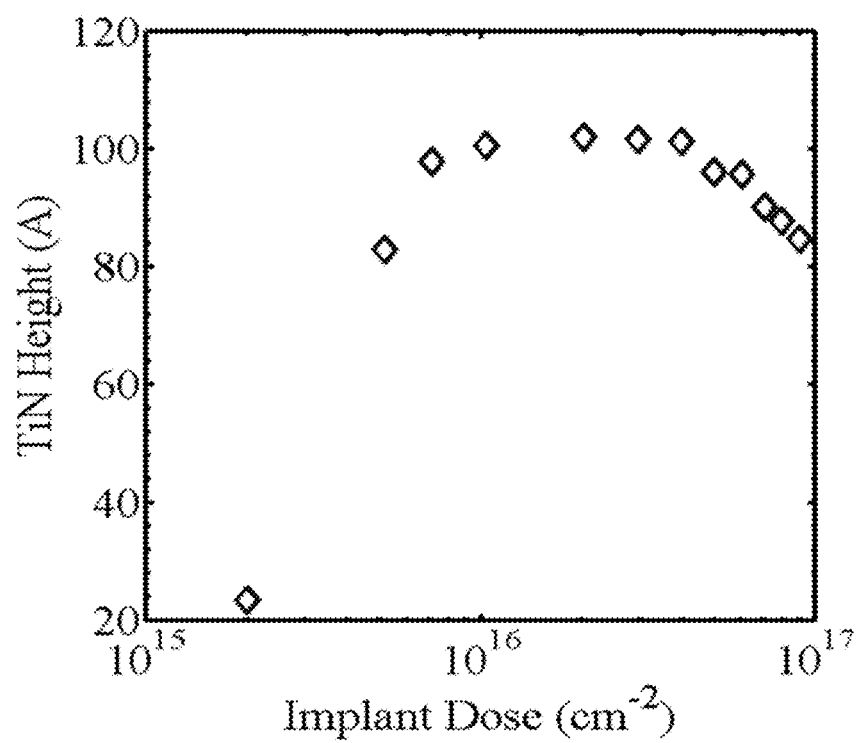
FIG. 7 is a graph showing titanium nitride (TiN) film height versus implant dose ($cm^{-2}$). The final TiN thickness was measured by a profilometer and compared with the implant dose.

The methods herein can be employed for any useful substrate or film. As can be seen, by employing the conditions and processes described in Example 1, Ga lithography was conducted on a tantalum (Ta) film (FIG. 6) and a titanium nitride (TiN) film (FIG. 7) disposed on an oxide substrate. Similar to the data provided for a niobium film in FIG. 2, implant doses of about $1\times16$ $cm^{-2}$ dose resulted in etching to the implant depth (FIGS. 6-7). The Ta and TiN films were etched under the conditions described in Example 1, which resulted in etching of 200 nm of Ta and 75 nm of TiN. Accordingly, the methods herein can be used to construct implant dose curves and determine optimal implant doses for any useful substrate.

Example 3: Formation of Nanowires and Pirani Gauges

Figure 8:
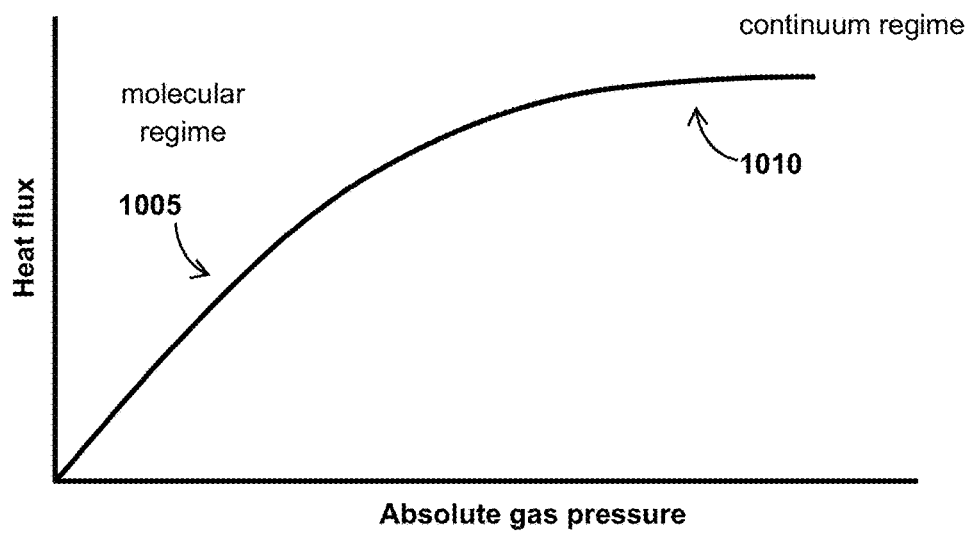
FIG. 8 provides a conceptual graph of the heat flux, i.e., the rate of heat transfer, from a warm wire to the surrounding gas over a range of gas pressures, according to the principles of operation of Pirani gauges as known in the prior art. Shown are the molecular regime 1005 and the continuum regime 1010.

The present invention also relates to microstructures and nanostructures formed by any method herein. For instance, such structures can include microwires and/or nanowires. Other structures include sensors, such as those useful for depositing as part of a back-end-of-line (BEOL) process. As an example only, the methods can be employed to form a Pirani gauge. The basic principle of operation of a Pirani gauge is illustrated by FIG. 8. As seen in the figure, there is a molecular regime 1005 at very low pressures, where the heat flux is proportional to the rate of collisions between the gas and the wire, and hence also proportional to the gas pressure. At the other extreme of high gas pressures, there is a continuum regime 1010 in which the gas is characterized by a constant thermal conductivity, and the heat flux is independent of pressure. The Pirani gauge operates with greatest sensitivity in the molecular regime.

An illustrative pressure-measurement system utilizing the principle described above is illustrated by FIG. 9. As seen there, a nanowire 1015 is suspended above a substrate. The ends of the nanowire contact respective contact pads 1020, 1021, which advantageously form ohmic contacts to the nanowire. The gallium implant will generally be sufficient to create the ohmic contact. An exemplary contact pad is the upper surface layer of a pillar supporting the nanowire. Hence it will be in direct thermal contact with the substrate. However, if the aspect ratio of the nanowire, i.e., the ratio of its length to its width, is large enough, the transport of heat away from the nanowire will be dominated by the collisions with gas molecules, and the contribution by direct conduction through the pillars will be negligible.

It should be noted in this regard that with other factors held constant, the shorter the length of the nanowire, the less sensitive the resulting Pirani gauge will be. Likewise, the wider the nanowire, the lower the sensitivity. Any of various combinations of dimensions can be implemented according to the desired sensitivity and other design requirements. For relatively high sensitivity, aspect ratios of 50, 100, or even more are feasible.

Figure 9:
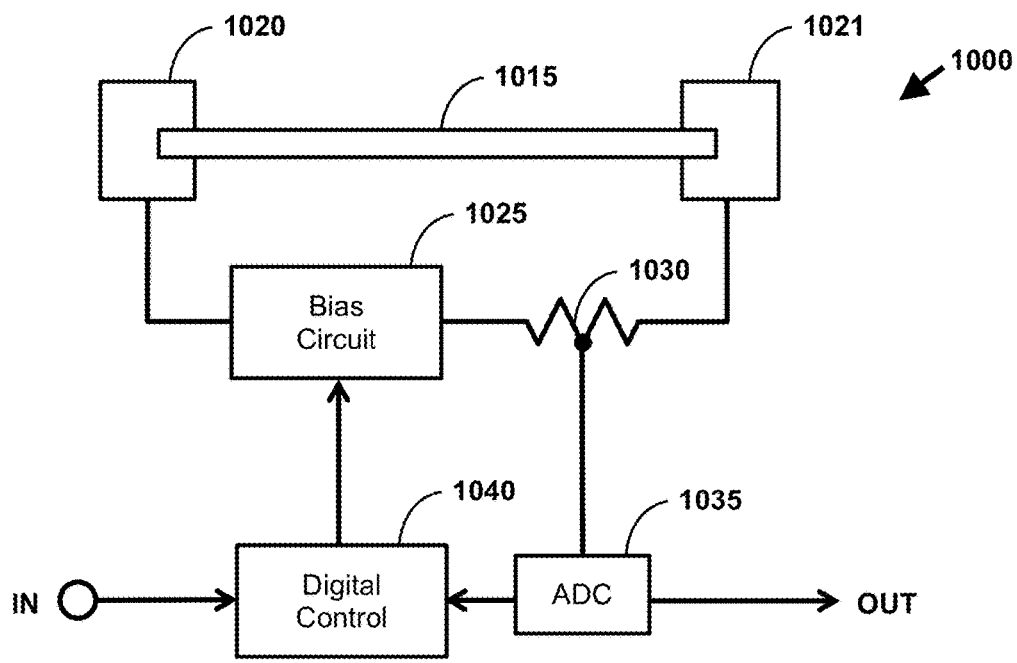
FIG. 9 provides a schematic drawing of an exemplary pressure-measurement system 1000 using a nanowire 1015.

With further reference to FIG. 9, a bias circuit 1025 applies a voltage between contact pads 1020, 1021, which causes a heating current to flow through the nanowire. The amount of current that is caused to flow depends on the current-voltage characteristic, or more simply the resistance, of the nanowire. This property, in turn, depends on the temperature of the nanowire. More specifically, the resistance of the nanowire, if it behaves in this respect as a typical semiconductor, decreases as the temperature rises.

In steady state at any given pressure, there will be a balance between the rate at which heat is supplied to the wire by the heating current and the rate at which heat is removed by collisions with gas molecules. For a fixed heating current, this balance will shift toward higher temperature as the gas pressure is reduced. Hence, the resistance of the nanowire will decrease as the pressure falls. Because the resistance of the nanowire is readily measurable, it provides an indication of the gas pressure.

Accordingly, a current-measuring element 1030, which for illustrative purposes is represented in the figure as a resistor, provides an analog voltage signal proportional to the heating current. This signal is converted to a digital signal in an analog-to-digital converter (ADC) 1035. The digital signal is provided as input to a digital control 1040, which in turn can control the voltage provided by a bias circuit 1025 according to any of various known biasing schemes. For example, the bias voltage may be varied so as to maintain a constant heating current while the pressure changes.

As further seen in FIG. 9, an externally generated input signal may be provided to a digital control 1040 for purposes of programming or direct manual control. The output signal from an ADC 1035 may be provided to external circuitry, e.g. for purposes of read-out and display.

The nanowire can be formed using any method described herein. In particular, the nanowire can be formed of any useful material, such as any described herein, as well as any other fluorine-etchable material. It should also be noted that the same technique, suitably modified, can be used to provide a Pirani gauge based on a metal wire instead of on a semiconductor wire. In that case, a metal deposition process, such as thermal evaporation, can be added to metal-coat the nanowire. By this means, a thin layer of metal can be added that is more conductive than the nanowire so as to dominate the current-voltage characteristic of the structure. In particular embodiments, the fabrication process is based on work reported in Henry M D et al., "Ga$^+$ beam lithography for suspended lateral beams and nanowires," *J. Vac. Sci. Technol. B* 2010 November/December; 28(6): C6F26-C6F30; and Henry M D et al., "Ga$^+$ beam lithography for nanoscale silicon reactive ion etching," *Nanotechnology* 2010; 21:245303 (8 pp.), each of which is incorporated herein by reference in its entirety.

We developed a two-step process using dry lithography to fabricate a nanowire (e.g., a silicon nanowire) suitable for use in a Pirani gauge. By suitably adjusting the geometry and the implant parameters, our nanowire can be tuned for measurements in various pressure ranges. Relevant geometric parameters include the length and width of the nanowire and its height above the substrate surface. One relevant implant parameter is the dose because increasing the dose of gallium decreases the resistance of the implanted nanowire. In an empirical study using circular areas 50 μm in diameter as etch masks, we found that the minimum dose required to maintain the fidelity of the etch mask for a given etch depth varied linearly from about $1 \times 10^{16}$ cm$^{-2}$ at a depth of 300 nm to about $7.5 \times 10^{16}$ cm$^{-2}$ at a depth of 2000 nm.

Here, we provide an example in which gallium is implanted into silicon for the purpose of defining a silicon nanowire. It is important to note, however, that silicon is not the only substrate material that is suitable for processing according to the principles to be described below. Germanium is another example of a suitable material. Other suitable materials are fluorine-etchable metals and compounds of metals such as titanium, tungsten, nickel, nickel titanium, nickel nitride, and nickel silicide. Suitable materials may further include tantalum nitride, titanium nitride, and nickel titanium nitride. Embodiments involving the processing of any of these materials, among others, are included within the scope of the present invention.

It should also be noted that possible alternatives to gallium as the implanted species are also included within the scope of the present invention. Such possible alternatives include aluminum and other Group III elements.

A very brief description of our process will now be provided with reference to FIG. 1C. First is an implantation step 151, in which a focused ion beam (FIB) is used to implant gallium to define the nanowire dimensions. Next are one or more etching steps 152,153 in which a dry silicon etch removes material from around the nanowire and releases the nanowire into suspension. The gallium is delivered in a highly collimated ion beam with a very narrow beam waist and low implantation fluence. A raster controls the shape of the implanted region, which in typical cases is substantially rectangular, i.e., rectangular except for small scattering effects at the ends. The depth of the implanted region is determined by the ion beam voltage. One result of the implantation is to render the (initially crystalline) silicon amorphous in the implanted region.

As explained above, the implantation step is followed by a dry etch. The dry etch has two phases. First, in a first phase 152, a highly anisotropic fluorine-based inductively coupled plasma reactive ion etch is used to define the structure by subtractive etching of the surrounding non-implanted silicon. Then, in a second phase 153, the etch parameters are changed so that the etch becomes isotropic. This phase results in the release of the nanowire from the substrate, rendering it ready for use. In typical trials involving multiple simultaneous writes, the implantation write time for a nanowire of width 100 nm, thickness (in the depth direction) 20 nm, and length 10 µm was 100 ms and the etch time was 160 seconds.

There are few limits on where within the package our process can be used to place a Pirani gauge. It can even be used to place a Pirani gauge on the sidewalls of structures. Unlike conventional Pirani gauges that use bridges having footprints in the hundreds of squared micrometers or more, a nanowire is readily made by our process with a footprint not more than one squared micrometer. Using our process, the nanowire can be suspended at any height (within practical limits), and can be made with a width as low as 30 nm or even somewhat less. It can be made with an aspect ratio of 330 or even more.

It should be noted that the lithographic technique described above does not require planar surfaces, and it can be performed subsequent to the CMOS processing of an integrated circuit wafer. It should also be noted that the same technique, suitably modified, can be used to provide a Pirani gauge based on a metal wire instead of on a semiconductor wire. In that case, a metal deposition process, such as thermal evaporation, can be added to metal-coat the silicon nanowire. By this means, a thin layer of metal can be added that is more conductive than the silicon nanowire so as to dominate the current-voltage characteristic of the structure.

However, we believe that for at least some applications, the semiconductive gauge offers certain advantages over a metallic gauge. For example, the implantation damage in the silicon suppresses phonon transport and as a consequence reduces thermal loss. Moreover, the resistivity of the silicon nanowire depends very strongly on temperature, leading to a very sensitive gauge. At low temperatures in particular, this is likely to offer advantages over metallic gauges.

Typical FIB tools have variable implantation voltage and variable beam currents. The beam voltage directly controls the implantation depth, straggle, skewness, and kurtosis. The beam current controls implantation rate and beam waist.

In an empirical study, we etched an array of gallium-implanted squares on a silicon substrate to a depth of 500 nm. In one array dimension, the squares were varied in size from 20 nm to 100 nm. The gallium implant dose was varied in the other array dimension from $1 \times 10^{16}$ cm$^{-2}$ to $8 \times 10^{16}$ cm$^{-2}$. By evaluating the difference between the desired pattern and the actual pattern for each square and comparing the results across the array, we estimated that pattern transfer was optimal at a dose of about $4.5 \times 10^{16}$ cm$^{-2}$. We also found that as the desired patterns became smaller, a higher dose was needed to adequately mask the etch. Although this process refers to silicon, the doses and conditions can be optimized for use with any other material, such as niobium, tantalum, titanium, or tungsten, as well as any material containing these metals.

For our experimental trials, we selected a beam voltage of 30 kV because this was believed to achieve the thickest possible layer of implanted gallium. We varied the beam current according to the desired size of the implanted region. To define a large structure such as a 50-µm-diameter contact pad, we typically set the beam current to 6.5 nA or 20 nA. A current of 20 nA yielded a relatively large beam waist of 143 nm. This still provided adequate resolution for defining micrometer-scale structures, while maintaining the implantation time within reasonable limits. To define small nanowire structures, it was typical to use a current of 260 pA, which yielded a beam waist of 15 nm. With still lower beam currents, we could achieve a beam waist as low as 4 nm.

As is well known in the art, the areal implantation dose is a function of the implantation time, the beam current, and the ion-beam scanning area. The implanted concentration profile is inferred from the areal dose according to known implantation models. Without wishing to be limited by mechanism, the maximum areal dose of gallium is limited by the solid solubility of gallium in silicon.

The areal implantation dose determines the maximum depth that can be achieved in the subsequent etching process, which is described in detail below. According to simple estimates, most of the implanted gallium is contained within a 20-nm band buried about 25 nm below the silicon surface. The first phase of the etching process is a highly anisotropic reactive ion etch that is masked by the implanted gallium layer. Ideally, the geometrical footprint defined by the implanted region can be maintained indefinitely while the surrounding silicon is removed to arbitrary depth, leaving a mesa of arbitrary height with vertical walls.

In practice, however, the implantation mask will eventually be eroded by the plasma etchant and spatial selectivity will consequently be lost. If the concentration of implanted gallium is high enough, the etchant will mill the implanted layer away at a rate (typically, about 5 nm/minute) that is substantially lower than the volatile etch rate (typically, about 400 nm/minute) of the surrounding silicon. Another possible limit on spatial selectivity is due to beam straggle, which broadens the edge of the implanted region.

The ultimate limits on spatial resolution come from a combination of lateral straggle, beam width, and etch conditions. Straggle is predictable and beam width can be measured, but the effect of etch conditions on spatial resolution is hard to predict with high precision.

Generally, we found that the etching process achieved a selectivity better than 30:1 between the implanted and non-implanted silicon. The precise selectivity that is achieved depends on the implantation dose and can be increased by increasing the dose. However, there is a tradeoff because increasing the implantation dose also increases the electrical conductivity of the resulting nanowire.

In an empirical study, we etched an array of gallium-implanted squares on a silicon substrate to a depth of 500 nm. In one array dimension, the squares were varied in size from 20 nm to 100 nm. The gallium implant dose was varied in the other array dimension from $1 \times 10^{16}$ cm$^{-2}$ to $8 \times 10^{16}$ cm$^{-2}$. By evaluating the difference between the desired pattern and the actual pattern for each square and comparing the results across the array, we estimated that pattern transfer was optimal at a dose of about $4.5 \times 10^{16}$ cm$^{-2}$. We also found that as the desired patterns became smaller, a higher dose was needed to adequately mask the etch.

Our etching procedure was performed in two stages using a Plasma-Therm inductively-coupled plasma (ICP) etching system. The first stage was a highly anisotropic reactive-ion etch (RIE), which we performed to define the desired structure. The anisotropic etch used sulfur hexafluoride ($SF_6$) as an etchant combined with octafluorocyclobutane ($C_4F_8$) for sidewall passivation. As explained above, this resulted in formation of a steep-sided mesa masked by the implanted region. The second stage was an isotropic etch, which we performed to release the nanowire. The isotropic etch used sulfur hexafluoride ($SF_6$) as the etchant without $C_4F_8$ passivation. In typical trials, the substrate was an SOI wafer with a 500 nm device layer. On those substrates, we etched down to the buried oxide (BOX).

Typical etch parameters were: $SF_6/C_4F_8$ at 50/90-110 sccm; ICP/Fwd of 900/20 Watts; pressure of 10 mTorr; and He backing of 4 Torr. For clarity, "Fwd power", "bias power", and "capacitively coupled power (CCP)" all refer to the power applied between an anode and a cathode with an established electric field normal to the substrate. The specific choice of a CCP (capacitively coupled plasma) system for the etching tool is optional. Generally, the nanowires can be fabricated using any plasma-etch tool. The duration of the first etching stage was typically 60-90 seconds at an etch rate of about 400 nm per minute. Once the first stage was completed, the etch tool automatically shifted to zero flow of $C_4F_8$ and an increase of ICP power to 1000 W with no Fwd power applied. These conditions defined the second phase, which had a typical duration of 11 seconds. During the second etching phase, i.e., the phase in which the nanowires were released, we observed that the 50 μm contact pads were also etched. However, they remained mostly intact.

Figure 10:
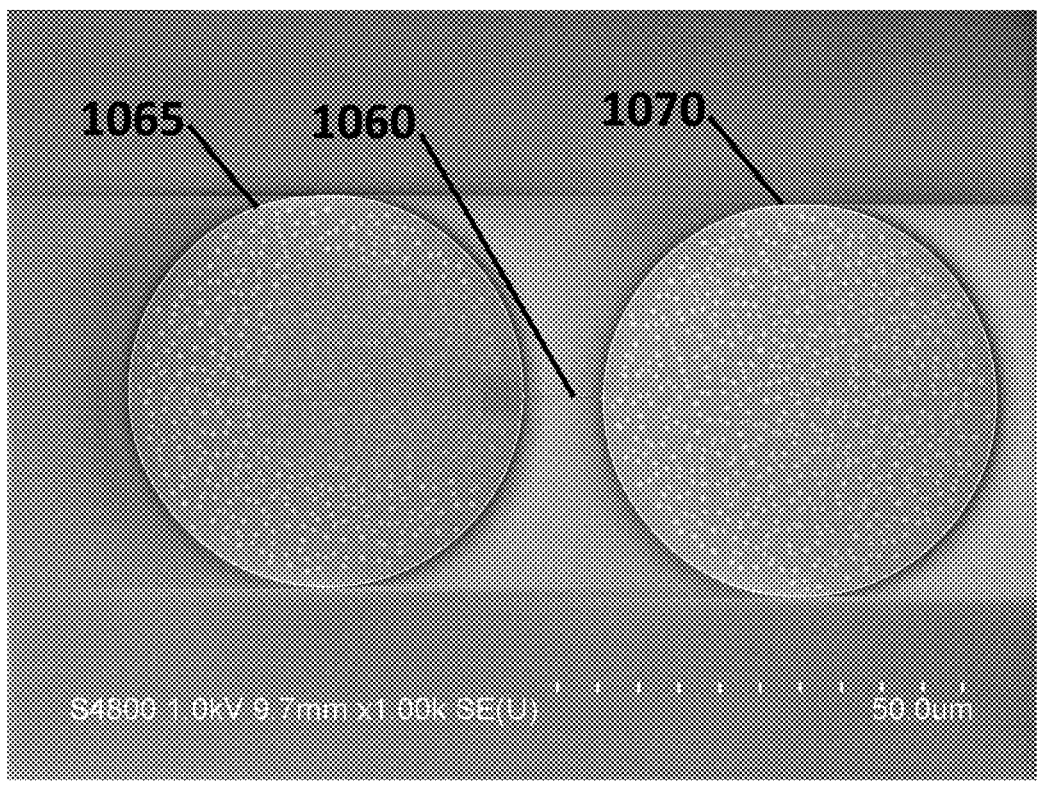
FIG. 10 is an image of an exemplary nanowire 1060 suspended between two contact pads 1065, 1070. The image is approximately to scale except for the width of the nanowire, which is exaggerated for visibility.
Figure 11:
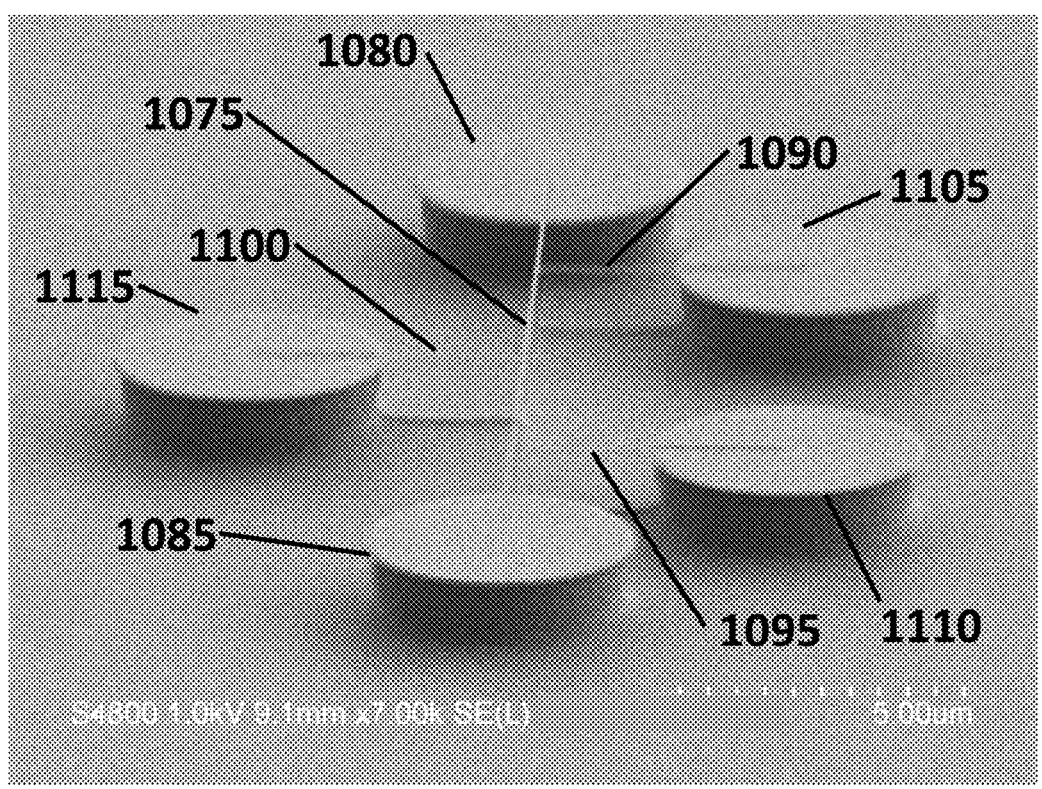
FIG. 11 is an image of a plurality of interconnected suspended nanowires 1070, 1090, 1095, 1100 of the kind depicted in FIG. 10. The image is approximately to scale except for the width of the nanowires, which is exaggerated for visibility.

FIG. 10 is a drawing of a single nanowire 1060 of length 10 μm suspended between two 50 μm contact pads 1065, 1070. In addition to fabricating single-beam structures such as the structure of FIG. 10, we also fabricated multiple-beam structures such as the structure shown in FIG. 11. The structure is shown approximately to scale except for the width of the nanowire, which is exaggerated for visibility. Regions of relatively high implanted dose due to the combination of the pillar dose and the beam dose are seen in positive relief in the figure.

A main nanowire 1075 extends between the contact pads 1080, 1085. Connected to a nanowire 1075 and extending perpendicularly to it are suspended subsidiary nanowires 1090, 1095, 1100, which respectively terminate at the contact pads 1105, 1110, 1115. Such an arrangement is useful, e.g., for measuring the resistance of the main nanowire by four-terminal sensing (also referred to as Kelvin sensing).

It is notable that the etch can be performed at low temperatures, i.e. temperatures less than about 400° C., and even can be performed at 25° C. or even less. Consequently, the fabrication of one or more nanowires can be performed on a substrate, e.g. on a die or wafer, after a CMOS process flow has been applied to the same substrate, for example to fabricate an integrated circuit or MEMS device.

For example, a metallization layer such as the top CMOS metal layer is patterned for signal routing. Then, an amorphous silicon layer is deposited over the metal. Then the amorphous silicon layer is patterned as described above to form one or more nanowires. Examples of appropriate techniques for depositing the amorphous silicon are PECVD, HDCVD, and sputter deposition.

More generally, the silicon layer for the nanowire can be deposited at any time during the CMOS process flow, or it can be done later, i.e., back-end-of-the-line (BEOL). For temperature compatibility, i.e. to avoid thermal modification of transistors, metal features, and the like, BEOL deposition would need to be carried out below 400° C.

Although it will generally be advantageous to deposit the amorphous silicon over a patterned metal layer, it should be noted that in an alternative procedure, the amorphous silicon can be deposited first, followed by deposition and patterning of the metal, followed by patterning of the nanowire.

It should also be noted that the etching of the nanowire can be performed at the level of an individual die, or alternatively it can be performed at wafer level. For example, the ion implant can be done at wafer level, followed by dicing of the wafer, etching at the die level to release the nanowires, and then packaging the individual dies.

Various nanowires were prepared and tested. For electrical characterization, we first confirmed that contacting the nanowire using the contact pads would provide low contact resistance. The etch parameters were ICP of 900 W, bias 15 W, and pressure 10 mT.

Figure 12:
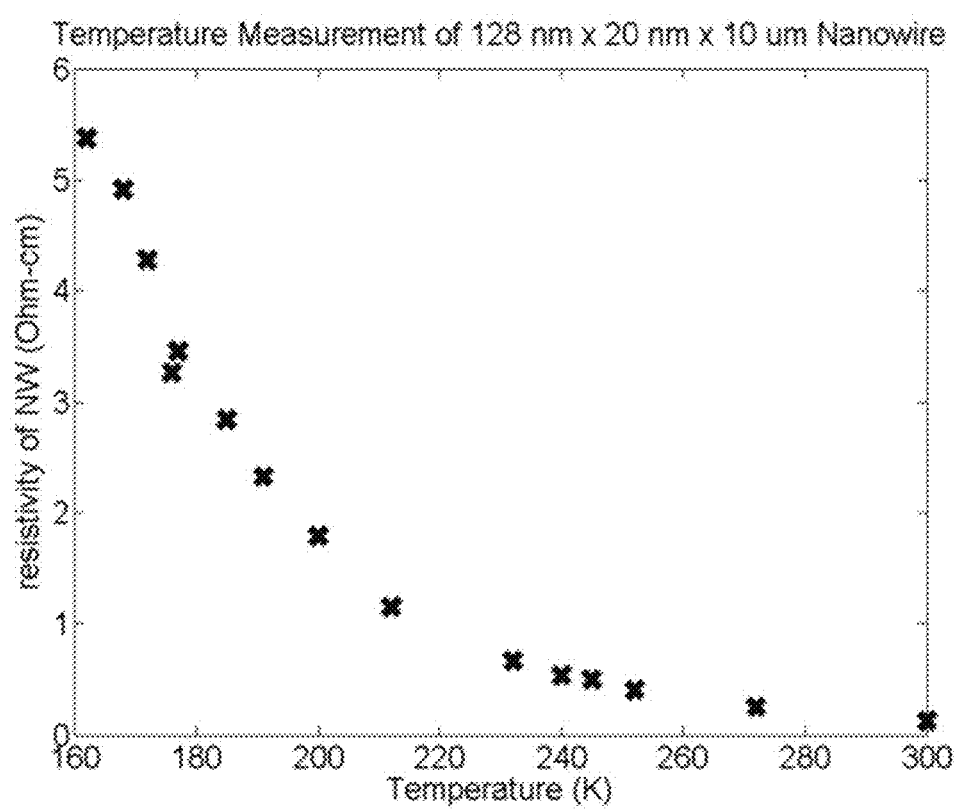
FIG. 12 is a graph of resistivity versus temperature obtained from experimental measurements performed on a nanowire.
Figure 13:
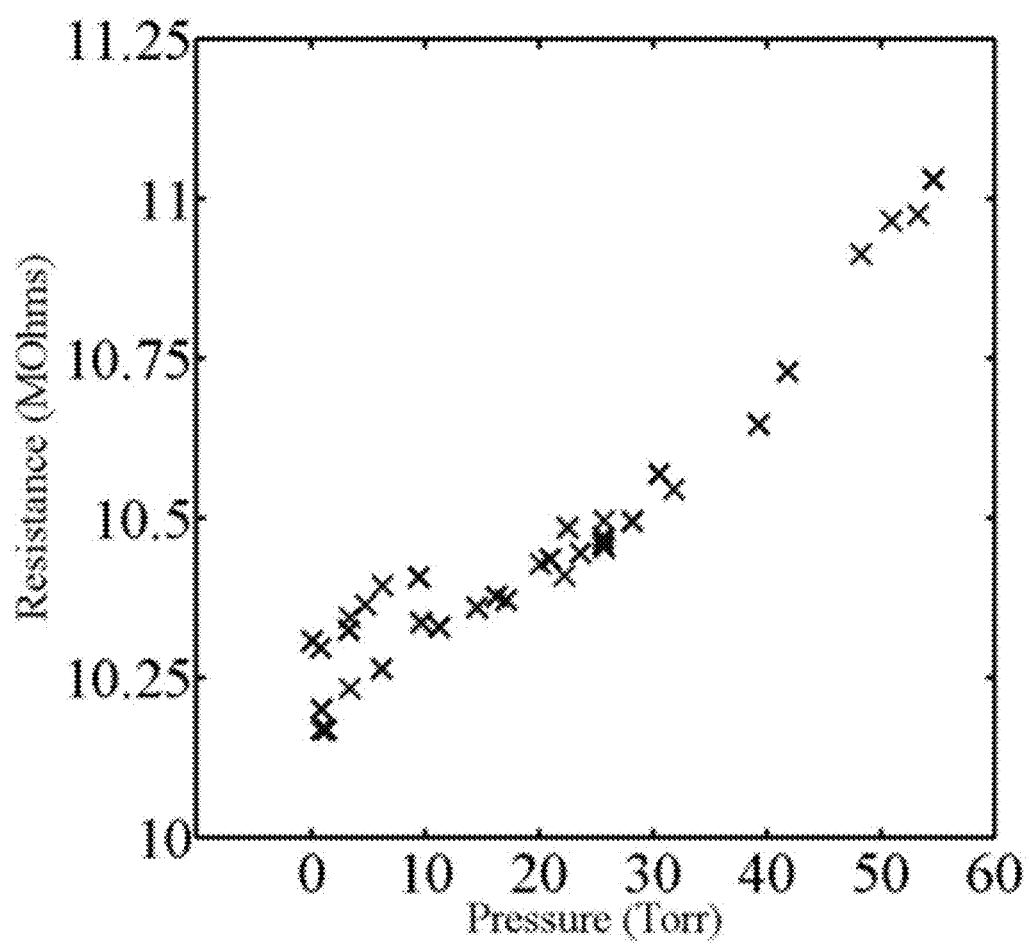
FIG. 13 is a graph of resistance versus pressure obtained from experimental measurements performed on a nanowire.

For a silicon nanowire of 10 μm length, 20 nm thickness, and 128 nm width on an SOI wafer, we conducted a series of temperature-controlled measurements on the nanowires. In particular, we obtained the data plotted in FIG. 12 as a graph of resistivity versus temperature. From the data, we obtained a thermal coefficient of resistivity of about 3.12 mil-cm/K. In addition, we prepared a silicon nanowire substantially as described above with an implanted dose of $8 \times 10^{16}$ $cm^{-2}$ and dimensions 100 nm×20 nm×2 μm. At these dimensions, the resistance of the nanowire was about 10 MΩ. We made two-probe resistance measurements of the suspended nanowire at a temperature of 300 K over a range of controlled pressures. The measurements were made at an applied voltage of 1 V; at this bias there was not enough Joule heating to induce annealing effects in the nanowire. We observed good sensitivity to pressure in the range 1-100 Torr, with a fractional resistance change over that range of about 7.5%. FIG. 13 provides a graph of the experimentally measured resistance versus pressure.

Figure 14:
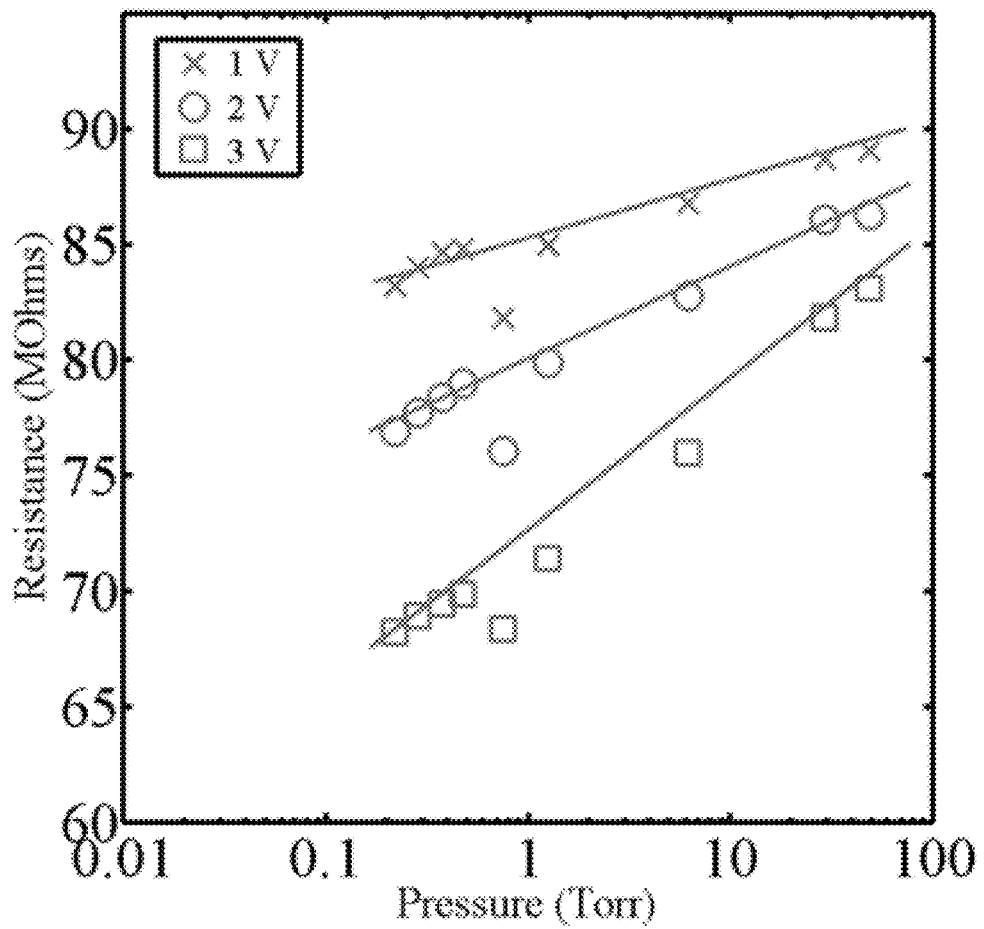
FIG. 14 is a graph of resistance versus pressure obtained over a pressure range from 100 mTorr to 100 Torr from experimental measurements performed on a nanowire. Three curves are shown in the figure, respectively corresponding to bias voltages of 1 V (top curve), 2 V (middle curve), and 3 V (bottom curve).

Finally, a silicon nanowire of dimensions 130 nm×20 nm×10 μm and resistance about 80 MΩ was fabricated substantially as described above with an implanted dose of $5 \times 10^{16}$ $cm^{-2}$. FIG. 14 shows the measured room-temperature resistance of this nanowire versus pressure over a pressure range from 100 mTorr to 100 Torr. Three curves are shown in the figure, respectively corresponding to bias voltages of 1 V, 2 V, and 3 V. As evidenced in the figure by increasing slope, increasing the bias voltage increased the sensitivity of the nanowire to pressure. More specifically, the 1-volt curve shows a fractional change in resistance over the full pressure range of 8.2%, the 2-volt curve shows a change of 13.3%, and the 3-volt curve shows a fractional change of 27.7%.

Other Embodiments

All publications, patents, and patent applications mentioned in this specification are incorporated herein by reference to the same extent as if each independent publication or patent application was specifically and individually indicated to be incorporated by reference.

While the invention has been described in connection with specific embodiments thereof, it will be understood that it is capable of further modifications and this application is intended to cover any variations, uses, or adaptations of the invention following, in general, the principles of the invention and including such departures from the present disclosure that come within known or customary practice within the art to which the invention pertains and may be applied to the essential features hereinbefore set forth, and follows in the scope of the claims.

Other embodiments are within the claims.

The invention claimed is:

1. A method comprising:
    exposing a region of a surface of a substrate with a focused ion beam of gallium so as to define an implanted region, wherein the implanted region comprises a superconductive region of niobium, tantalum, tungsten, and/or titanium nitride; and
    removing material from regions laterally adjacent to and below the implanted superconductive region by subtractive etching, the subtractive etching being a two-phase process including
        a first phase of anisotropic etching for removing non-implanted material laterally adjacent to the implanted superconductive region to define a superconductive structure; and
        a second phase of isotropic etching for removing non-implanted material below the implanted superconductive region, thereby releasing the superconductive structure so as to be held in suspension over the substrate.

2. The method of claim 1, wherein the surface, or a portion thereof, comprises a layer of metal or a metal compound deposited on the substrate.

3. The method of claim 2, wherein the metal or metal compound is selected from the group consisting of niobium, niobium nitride, niobium silicide, niobium silicon nitride, niobium aluminum nitride, niobium oxide, niobium titanium, niobium titanium nitride, titanium nitride, tantalum, tantalum oxide, tantalum nitride, and alloys thereof.

4. The method of claim 1, wherein the subtractive etching is performed by a dry etching process.

5. The method of claim 4, wherein the subtractive etching process is performed within a temperature range of about 25° C. to about 400° C.

6. The method of claim 5, wherein the subtractive etching process is performed under conditions including a low pressure less than about 20 mTorr.

7. The method of claim 5, wherein the subtractive etching process is performed in the presence of an etchant and a passivation agent.

8. The method of claim 5, wherein the subtractive etching process is performed by a fluorine-based inductively coupled plasma reactive ion etch.

9. The method of claim 8, wherein the fluorine-based inductively coupled plasma reactive ion etch is performed, at least in part, in a continuous phase using an etchant and a passivation agent.

10. The method of claim 9, wherein the etchant is one or more species selected from the group consisting of $SF_6$, $F_2$, $XeF_3$, $NF_3$, $BF_3$, HCl, and HF; and the passivation agent is one or more species selected from the group consisting of $CF_4$, $C_2F_2$, $C_2F_4$, $C_2F_6$, $C_3F_5$, $C_4F_8$, $C_4F_6$, $C_5F_8$, $CHF_3$, $CH_2F_2$, $CH_3F$, $C_2H_2F_2$, and $O_2$.

11. The method of claim 10, wherein the etchant further comprises one, two, or all three species selected from the group consisting of argon, nitrogen, and oxygen.

12. The method of claim 1, wherein the exposing step comprises rastering the focused ion beam over the region.

13. The method of claim 1, wherein the focused ion beam comprises a voltage less than about 50 keV.

14. The method of claim 1, wherein the first phase is performed using sulfur hexafluoride ($SF_6$) as an etchant combined with octafluorocyclobutane ($C_4F_8$) as a passivation agent; and the second phase is performed using sulfur hexafluoride ($SF_6$) as the etchant without $C_4F_8$ passivation.

15. The method of claim 1, further comprising, prior to the exposing step, depositing a film comprises niobium, tantalum, tungsten, and/or titanium nitride on the substrate, thereby providing the film as a surface for the exposing step.

16. The method of claim 1, further comprising, after the removing step, eliminating a gallium-rich portion of the implanted region.

17. The method of claim 1, wherein the method is performed as a back-end-of-line (BEOL) process, after a CMOS process flow is used to fabricate one or more integrated circuits on the substrate.

* * * * *